United States Patent
Takahashi et al.

(10) Patent No.: US 9,502,314 B2
(45) Date of Patent: Nov. 22, 2016

(54) METHOD FOR MANUFACTURING TESTED APPARATUS AND METHOD FOR MANUFACTURING SYSTEM INCLUDING TESTED APPARATUS

(71) Applicant: Micron Technology, Inc., Boise, ID (US)

(72) Inventors: Tetsuji Takahashi, Tokyo (JP); Toru Ishikawa, Tokyo (JP); Kazuya Takakura, Toyko (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/445,603

(22) Filed: Jul. 29, 2014

(65) Prior Publication Data

US 2015/0037914 A1  Feb. 5, 2015

(30) Foreign Application Priority Data

Jul. 31, 2013 (JP) .................................. 2013-159057
Mar. 19, 2014 (JP) .................................. 2014-056884

(51) Int. Cl.
*H01L 21/66* (2006.01)
*G01R 31/26* (2014.01)
*H01L 25/065* (2006.01)
*H01L 23/00* (2006.01)

(52) U.S. Cl.
CPC .............. *H01L 22/14* (2013.01); *H01L 24/94* (2013.01); *H01L 25/0652* (2013.01); *H01L 2224/16145* (2013.01); *H01L 2224/73204* (2013.01); *H01L 2924/15311* (2013.01)

(58) Field of Classification Search
None
See application file for complete search history.

(56) References Cited

U.S. PATENT DOCUMENTS

| 2004/0261049 | A1* | 12/2004 | Mohr | G11C 17/18 |
| | | | | 714/710 |
| 2011/0244605 | A1* | 10/2011 | Yamamori | 438/18 |
| 2012/0299610 | A1* | 11/2012 | Bieck | G01R 31/2887 |
| | | | | 324/754.03 |
| 2013/0032947 | A1* | 2/2013 | Park | H01L 21/568 |
| | | | | 257/774 |
| 2013/0076384 | A1 | 3/2013 | Chang | |
| 2013/0162282 | A1* | 6/2013 | Hatakeyama | H01L 22/30 |
| | | | | 324/762.01 |
| 2015/0032933 | A1* | 1/2015 | Bartley et al. | 710/316 |

* cited by examiner

*Primary Examiner* — Pamela E Perkins
(74) *Attorney, Agent, or Firm* — Perkins Coie LLP

(57) ABSTRACT

Disclosed herein is a method for manufacturing a tested apparatus that includes forming a stacked structure that includes a plurality of first semiconductor chips stacked over a semiconductor wafer. The semiconductor wafer comprises a plurality of second semiconductor chips that are arranged in matrix of a plurality of rows and columns. Each of the first semiconductor chips is stacked over and electrically connected to a different one of the second semiconductor chips. The method further includes contacting a probe card to at least one of the first semiconductor chips to perform a first test operation on a corresponding one of the second semiconductor chips with an intervention of the at least one of the first semiconductor chips so that a plurality of tested apparatus each comprising a pair of first and second semiconductor chips stacked with each other is derived.

18 Claims, 30 Drawing Sheets

US 9,502,314 B2

METHOD FOR MANUFACTURING TESTED APPARATUS AND METHOD FOR MANUFACTURING SYSTEM INCLUDING TESTED APPARATUS

BACKGROUND

Embodiments of the present invention relate to a method of manufacturing a semiconductor apparatus, and particularly to a method of manufacturing a semiconductor apparatus in which a plurality of semiconductor chips are stacked.

In recent years, the miniaturization and higher-performance of various semiconductor apparatus equipped with electronic equipment have been strongly desired. According to such demands, the technology known as SiP (System in Package), which enables a plurality of semiconductor chips to be contained in one package, has gained attention. In the SiP, a plurality of semiconductor chips with various functions necessary to configure a certain system are equipped. In one example, logic chips that perform operations, such as MPU (Micro-Processing Unit) or SoC (System on Chip), and memory chips that serve as work memories are contained in one package.

In such a case, a vendor of memory chips ships memory chips that have yet to be packaged (unpackaged). This means that the vendor of memory chips needs to test the unpackaged memory chips. As a method of testing the unpackaged memory chips, a method of testing the chips in a wafer state using a wafer tester (probe card) is known.

However, in recent years, with the advent of larger capacities of semiconductor memory and higher-speed data transfer rates, a stacked semiconductor memory in which a plurality of memory chips are stacked has been developed. In the case of such a stacked semiconductor memory, defects could occur in the semiconductor memory not only during a wafer process but also during a stacking process.

Therefore, the manufacturing of the stacked semiconductor memory requires a new test process to detect defects in the stacked semiconductor memory (or a stacked apparatus of semiconductor chips). In particular, as described above, in the case of a stacked semiconductor memory contained in the SiP, a process of testing a stacked apparatus of semiconductor chips that is unpackaged is required. For example, U.S. Patent Application Publication No. 2013/0076384 discloses a method of testing a stacked apparatus of semiconductor chips that is unpackaged.

SUMMARY

In one embodiment, there is provided a method for manufacturing a tested apparatus that includes: forming a stacked structure that includes a plurality of first semiconductor chips stacked over a semiconductor wafer, the semiconductor wafer comprising a plurality of second semiconductor chips that are arranged in matrix of a plurality of rows and columns, each of the first semiconductor chips being stacked over and electrically connected to a different one of the second semiconductor chips; and contacting a probe card to at least one of the first semiconductor chips to perform a first test operation on a corresponding one of the second semiconductor chips with an intervention of the at least one of the first semiconductor chips so that a plurality of tested apparatus each comprising a pair of first and second semiconductor chips stacked with each other is derived.

In another embodiment, there is provided a method for manufacturing a tested apparatus, the method including: forming a stacked structure that includes a plurality of first and second semiconductor chips stacked over a semiconductor wafer, the semiconductor wafer comprising a plurality of third semiconductor chips that are arranged in matrix of a plurality of rows and columns, each of the second semiconductor chips being stacked over and electrically connected to a different one of the third semiconductor chips, each of the first semiconductor chips being stacked over and electrically connected to a different one of the second semiconductor chips; and contacting a probe card to at least one of the first semiconductor chips to perform a first test operation on a corresponding one of the second semiconductor chips with an intervention of the at least one of the first semiconductor chips so that a plurality of tested apparatus each comprising a set of first, second and third semiconductor chips stacked with each other is derived.

DETAILED DESCRIPTION OF THE EMBODIMENTS

In a method of manufacturing a semiconductor apparatus which contains a chip stacked structure according to an embodiment of the present invention, tests are performed before a stacking process and after the stacking process with at least lower-layer semiconductor chips remaining in a wafer state. Therefore, the plane positions of test pads of lower-layer semiconductor chips in a wafer state match the plane positions of test pads of upper-layer semiconductor chips. Therefore, a wafer tester or a probe card that is used before the stacking can be used for tests after the stacking.

Hereinafter, with reference to the accompanying drawings, several preferred embodiments of the present invention will be described in detail. In a first embodiment, a method of forming a chip stacked structure by stacking singulated memory chips on a lower-layer base wafer, i.e. a method of manufacturing a chip stacked structure device using CoW (Chip on Wafer) system is described. In a second embodiment, a method of forming a chip stacked structure by stacking another wafer on a base wafer, i.e. a method of manufacturing a chip stacked structure using WoW (Wafer on Wafer) system is described.

Figure 1A:
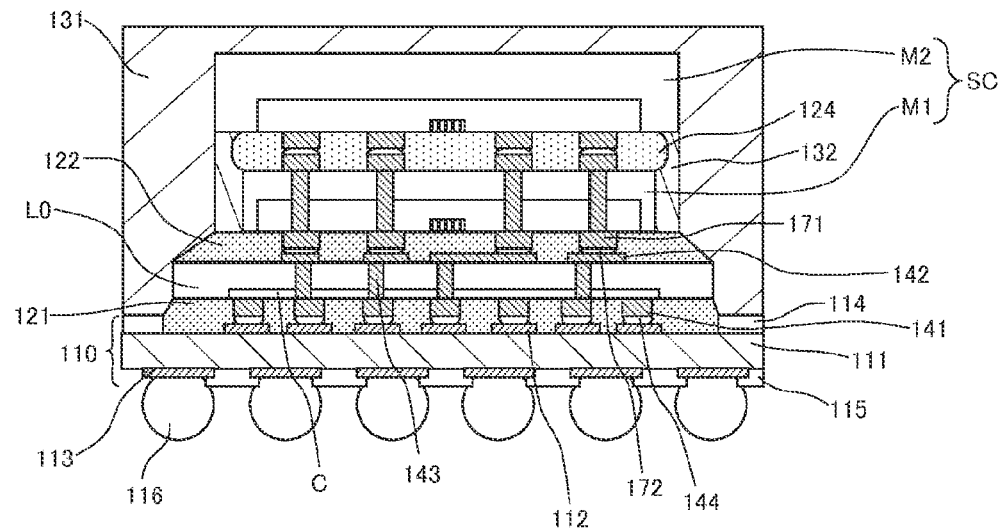
FIG. 1A is a schematic cross-sectional view indicative of the configuration of a semiconductor apparatus (SiP) 100A of a first example manufactured in an embodiment of the present invention.

Referring now to FIG. 1A, the semiconductor apparatus 100A is SiP having a so-called 3D (3 Dimension) structure. The semiconductor apparatus 100A has a structure in which a logic chip L0 and a stacked structure SC, which contains a first memory chip (a first semiconductor chip) M1 and a second memory chip (a second semiconductor chip) M2, are stacked on a wiring board 110 in a three-dimensional manner.

More specifically, on the wiring board 110, the logic chip L0 is flip-chip mounted in a face-down manner. Moreover, on the logic chip L0, the chip stacked structure SC is flip-chip mounted in a face-down manner. The space between the wiring board 110 and the logic chip L0 is filled with a filler 121. The space between the logic chip L0 and the chip stacked structure SC is filled with a filler 122. On the wiring board 110, sealing resin 131 is provided so as to cover the logic chip L0 and the chip stacked structure SC.

For example, the logic chip L0 is a semiconductor chip for a control system, such as SoC (System on Chip) or MPU (Micro-Processing Unit). In the semiconductor apparatus 100A of the first example shown in FIG. 1A, on a main surface of the logic chip L0, surface bumps 141 are provided; on a back surface thereof, back-surface bumps 142 are provided. The back-surface bumps 142 are connected to circuit elements formed on a circuit layer C of the logic chip L0 via through electrodes 143, which are provided so as to pass through the logic chip L0. Moreover, the back-surface bumps 142 are joined to surface bumps 171 provided on the first memory chip M1 of the stacked structure SC, via a solder layer 172. The stacked structure SC will be detailed later with reference to FIG. 2A.

For example, the wiring board 110 includes an insulation base (glass epoxy base) 111, which is made by impregnating glass cloth (cloth made of glass fiber) with epoxy resin; connection pads 112, which are formed on one surface of the insulation base 111; lands 113, which are formed on the other surface of the insulation base 111. Furthermore, on both the one and the other surface of the insulation base, insulation films 114 and 115, such as solder resist, are formed.

The connection pads 112 are connected to the surface bumps 141 of the logic chip L0 via a solder layer 144. On the lands 113, solder balls 116, which serve as external terminals, are formed. The connection pads 112 are electrically connected to the corresponding lands 113 via conductive paths (through-holes and the like; not shown), which are formed inside the insulation base 111, respectively. In this manner, the logic chip L0 is electrically connected to the external terminals or the solder balls 116.

The fillers 121 and 122 are a nonconductive adhesive known as NCP (Non-conductive Paste). As the NCP, a well-known nonconductive adhesive used for bonding of semiconductor chips, such as an epoxy resin-based adhesive, may be used. As the sealing resin 131, a well-known sealing resin, such as an epoxy resin-based sealing resin, may be used.

Figure 1B:
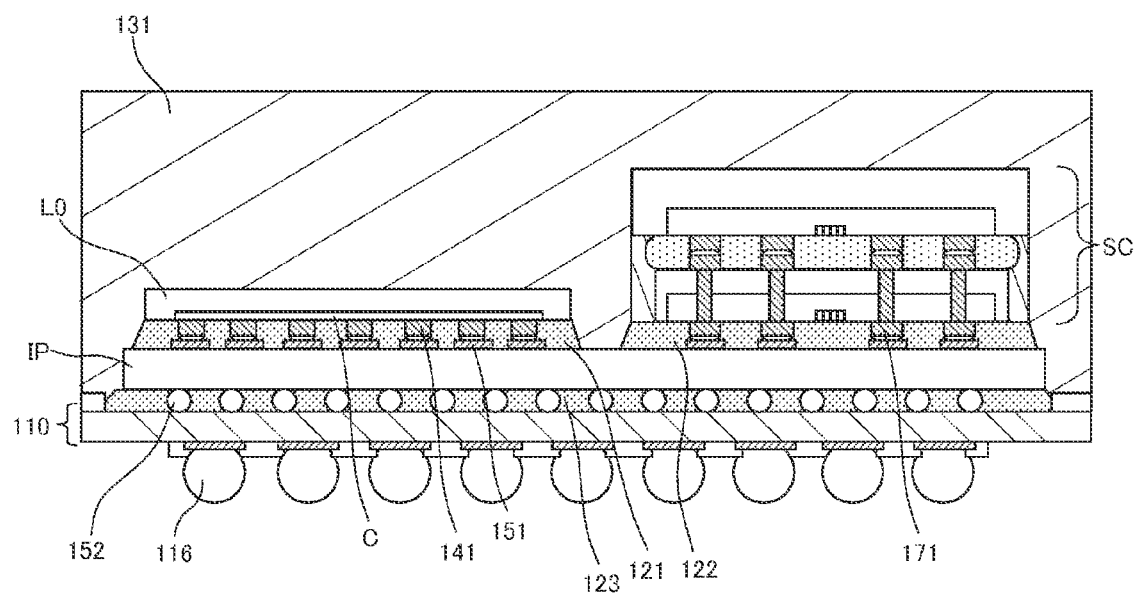
FIG. 1B is a schematic cross-sectional view indicative of the configuration of a semiconductor apparatus (SiP) 100B of a second example manufactured in an embodiment of the present invention.

Turning to FIG. 1B, the semiconductor apparatus 100B is SiP having a so-called 2.5D (2.5 Dimension) structure. The semiconductor apparatus 100B has a structure in which a logic chip L0 and a stacked structure SC, which contains first and second memory chips M1 and M2, are placed on a surface of an interposer IP in a two-dimensional manner. The interposer IP is mounted on a wiring board 110. The space between the interposer IP and the wiring board 110 is filled with a filler 123, such as NCP.

As the interposer IP, for example, a well-known interposer may be used, such as the one made of glass epoxy base or a so-called silicon interposer whose base is made of silicon substrate. Connection pads 151 are formed on one surface of the interposer IP. Solder bumps 152 are formed on the other surface of the interposer IP. The connection pads 151 are connected to surface bumps 141 of the logic chip L0 and surface bumps 171 of the first memory chip M1 of the stacked structure SC. The connection pads 151 are electrically connected to the corresponding solder bumps 152 via conductive paths (through-holes and the like; not shown), which are formed in the interposer IP, respectively.

The rest of the configuration is basically identical to that of the semiconductor apparatus 100A shown in FIG. 1A. Therefore, the same components are represented by the same reference symbols, and will not be described again.

In the case of the semiconductor apparatuses 100A and 100B, an example of face-down mounting (flip-chip mounting), in which the circuit layer C of the logic chip L0 is mounted in such a way as to face the wiring board 110 or the interposer IP, is described. However, the present invention is not limited to this. For example, the logic chip L0 may be mounted in an face-up manner. In this case, the logic chip L0 can be connected to the wiring board 110 or the interposer IP at the back-surface bumps of the logic chip L0 via through electrodes formed in the logic chip L0. Instead of forming the through electrodes in the logic chip L0, the logic chip L0 may be connected to the wiring board 110 or the interposer IP through bonding wires.

Figure 2:
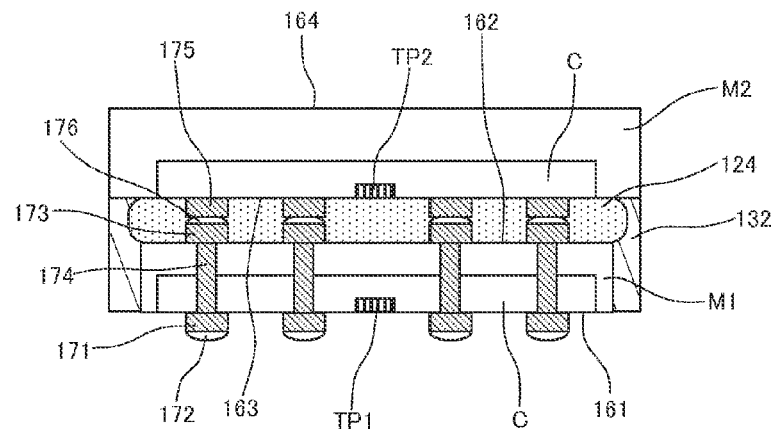
FIG. 2 is a schematic cross-sectional view indicative of an embodiment of the configuration of a chip stacked structure SC.

Turning to FIG. 2, the stacked structure SC has a structure in which the first memory chip M1 and the second memory chip M2 are stacked. The first memory chip M1 includes a main surface 161 on which a circuit layer C is formed, and a back surface 162. The second memory chip M2 includes a main surface 163 on which a circuit layer C is formed, and a back surface 164. The memory chips M1 and M2 are stacked in such a way that the back surface 162 of the first memory chip M1 faces the main surface 163 of the second memory chip M2. The space between the first memory chip M1 and the second memory chip M2 is filled with a filler 124. The side surface of the first memory chip M1 is covered with sealing resin 132.

Although not specifically limited, the first memory chip M1 and the second memory chip M2 each are Wide-IO DRAM (Wide-IO Dynamic Random Access Memory), which is one type of DRAM (Dynamic Random Access Memory), for example. The details of Wide-IO DRAM will be given later.

The first memory chip M1 includes a plurality of surface bumps (first bump electrodes) 171 which are formed on the main surface 161; a plurality of back-surface bumps (second bump electrodes) 173 which are formed on the back surface 162; and a plurality of through electrodes 174 which pass through the chip to connect the surface bumps 171 to the back-surface bumps 173, respectively. Solder layers 172 and 176 are provided on surfaces of the surface bumps 171 and the back-surface bumps 173, respectively. Furthermore, the first memory chip M1 includes a test pad (a first pad electrode) TP1, which is formed on the main surface 161. Incidentally, FIG. 2 shows only one test pad TP1. In fact, a plurality of test pads (first pad electrodes) TP1 are arranged in a direction perpendicular to the surface of paper.

The filler 124 is a nonconductive adhesive known as NCF (Non-conductive Film). As the NCF, a well-known nonconductive adhesive used for bonding of semiconductor chips, such as an epoxy resin-based adhesive, may be used.

The configuration of the second memory chip M2 is almost identical to that of the first memory chip M1 except that no back-surface bumps and no through electrodes are formed. The second memory chip M2 includes surface bumps (third bump electrodes) 175. The surface bumps 175 of the second memory chip M2 are joined to the back-surface bumps 173 of the first memory chip M1 via the solder layer 176, respectively. The thickness of the second memory chip M2 is preferably greater than that of the first memory chip M1. If the thickness of the second memory chip M2 is greater than that of the first memory chip M1, the warpage can be reduced when the stacked structure SC is mounted on the SiP.

The solder layer 172 that is provided on the surface bumps 171 of the first memory chip M1 is joined to the back-surface bumps 142 of the logic chip L0 if the semiconductor apparatus 100A shown in FIG. 1A is employed. If the semiconductor apparatus 100B shown in FIG. 1B is employed, the solder layer 172 is joined to the connection pads 151 of the interposer IP.

Figure 3:
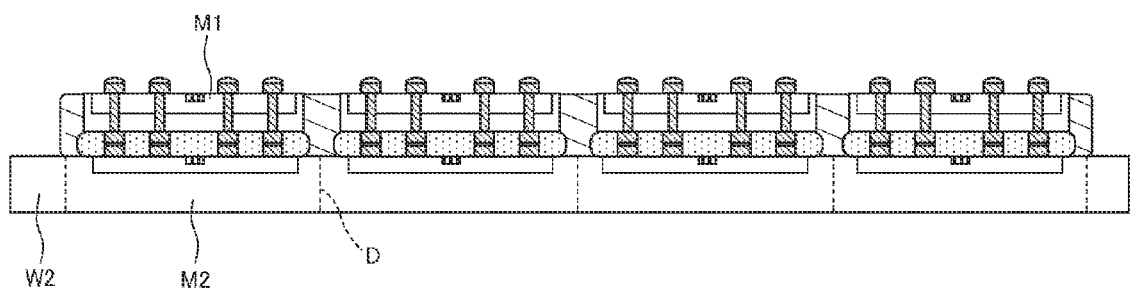
FIG. 3 is a schematic cross-sectional view indicative of an embodiment of a chip-on wafer KGD before the chip stacked structure SC is divided into pieces.

Turning to FIG. 3, the chip-on wafer KGD includes a base wafer (a semiconductor wafer, a second wafer) W2, in which a plurality of second memory chips M2 are formed, and a plurality of first memory chips M1 which are mounted on a main surface of the base wafer W2. The first memory chips M1 have already been singulated. Each of the first memory chips M1 is mounted on the second memory chips M2, respectively. A plurality of the stacked structures SC shown in FIG. 2 can be obtained by cutting the chip-on wafer KGD having the above-described configuration along dicing lines D.

Figure 4:
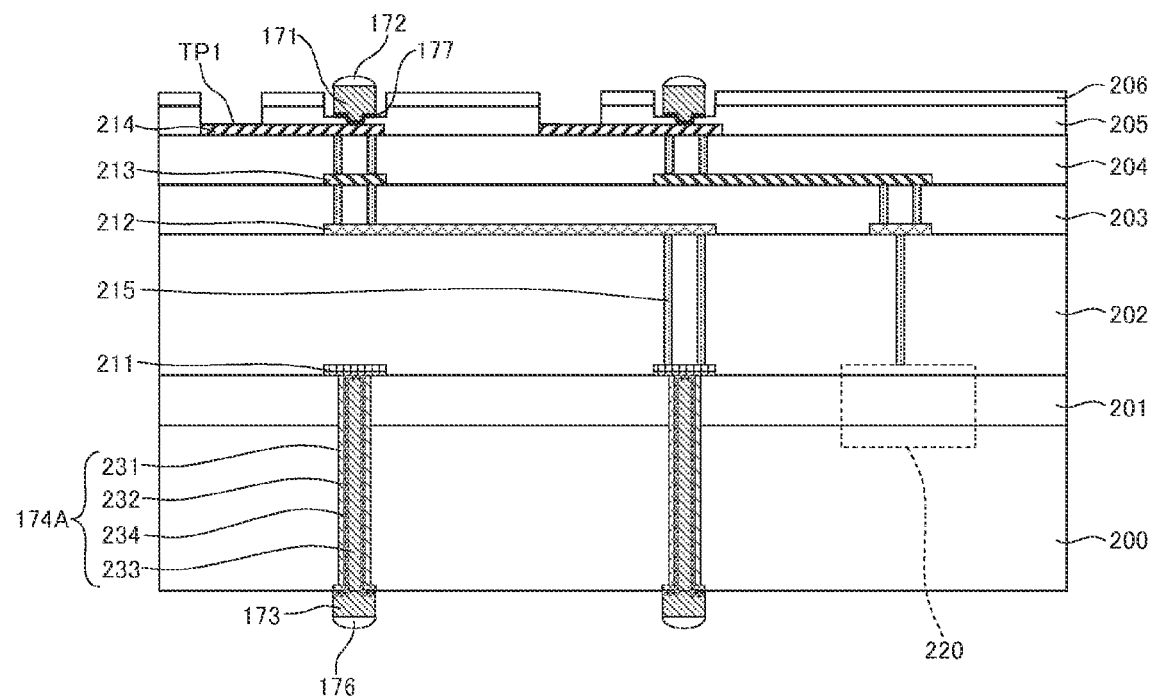
FIG. 4 is a schematic cross-sectional view indicative of an embodiment of the configuration of a through electrode 174A of a staggered type (staggered routing), among through electrodes 174 provided in a first memory chip M1.

Turning to FIG. 4, the first memory chip M1 has a structure in which first to fourth interlayer insulation films 201 to 204 are stacked on a main surface (a first surface) of a semiconductor substrate (a first semiconductor substrate) 200; a surface of the fourth interlayer insulation film 204 is covered with a passivation film 205 and a protective film 206. The semiconductor substrate 200 is a substrate made of a well-known semiconductor material such as silicon, for example. The first to fourth interlayer insulation films 201 to 204 are insulation films made of a well-known insulation material such as silicon oxide or silicon nitride. The passivation film 205 and the protective film 206 protect wiring layers 211 to 214 and an internal circuit 200 from outside moisture and metal ions. In one example, the passivation film 205 may be a silicon nitride film, and the protective film 206 may be a polyimide film. The passivation film 205 and the protective film 206 have openings in locations corresponding to the test pad TP1 and the surface bumps 171, respectively.

The upper surfaces of the first to fourth interlayer insulation films 201 and 204 are provided with the first to fourth wiring layers 211 to 214, respectively. Each of the first to fourth wiring layers 211 to 214 is made of a well-known metal wiring material, such as tungsten (W), aluminum (Al), or copper (Cu), are provided. The different wiring layers are connected to each other via through-hole conductors 215, which are provided so as to pass through the corresponding interlayer insulation films 202 to 204.

The surface bumps 171 are formed in the openings of the protective film 206 and passivation film 205. Although not specifically limited, the surface bumps 171 are made up of a cylindrical copper post, and a nickel (Ni) layer and a gold (Au) layer, which are stacked on an upper surface of the copper post. On the upper surfaces of the surface bumps 171, a solder layer 172 is formed. The solder layer 172 may be made of a well-known solder material, such as an alloy containing Sn—Ag, for example. Lower ends of the surface bumps 171 are electrically connected to the fourth wiring layer 214 via a plating seed layer 177, which is made of copper (Cu).

The test pad TP1 is formed as a part of the fourth wiring layer 214. Both the passivation film 205 and the protective film 206 include an opening in a location corresponding to the test pad TP1. The test pad TP1 is exposed through the opening. The test pad TP1 is connected to a surface bump 171 corresponding to the test pad TP1, via the fourth wiring layer 214. While the details will be described later with reference to FIG. 11, the first memory chip M1 has two types of terminals, or test bumps and test pads that serve as test terminals. The test bumps are electrically connected to the corresponding test pads, respectively.

In the semiconductor substrate 200, a through substrate via 231 is formed. The through substrate via 231 passes through the semiconductor substrate 200 from the back surface to the top surface, and passes through the first interlayer insulation film 201, and reaches the first wiring layer 211. On an internal sidewall of the through substrate via 231, a via insulation film 232 is formed. The inner space thereof is filled with a through-substrate conductor 233. Between the through-substrate conductor 233 and the first wiring layer 211, the via insulation film 232 is not formed. As the via insulation film 232, for example, a silicon oxide film is available. As the through-substrate conductor 233, for example, copper (Cu) is available. Between the through-substrate conductor 233 and the via insulation film 232, and between the through-substrate conductor 233 and the first wiring layer 211, a plating seed layer 234 made of copper is formed.

The back-surface bumps 173 are formed on the back surface of the semiconductor substrate 200 in such a way as to overlap with the through substrate vias 231, respectively, when seen in planar view. The back-surface bumps 173 are formed integrally with the through-substrate conductors 233. Therefore, the back-surface bumps 173 can be also described as portions of the through-substrate conductors 233 that are protruding from the back surface of the semiconductor substrate 200. On the lower surfaces of the back-surface bumps 173, a solder layer 176 made of an Sn—Ag alloy or the like is formed.

The internal circuit 220 includes circuit elements, such as transistors. The internal circuit 220 includes circuit elements with various functions required for the first memory chip M1 to function as a memory apparatus.

The structure of the staggered-type through electrode is characterized in that a surface bump 171 and a back-surface bump 173 that are formed and arranged in a longitudinal direction are not electrically connected, and that the surface bump 171 is electrically connected to another back-surface bump 173 that is formed so as to have an offset in the horizontal direction, that is, a surface bump 171 is electrically connected to a back-surface bumps 173 that is formed in a position that does not overlap when viewed in planar view. This connection can be achieved by a multilevel wiring structure that contains the wiring layers 211 to 214.

Figure 5:
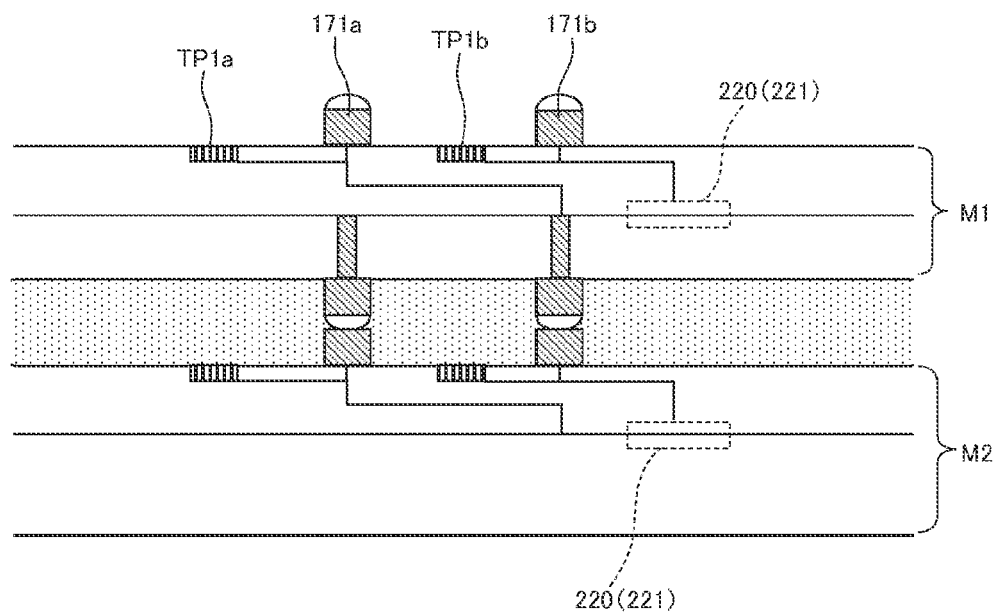
FIG. 5 is a schematic diagram indicative of an embodiment of the electrical connection relationship of the staggered-type through electrode 174A.

Turning to FIG. 5, two surface bumps 171a and 171b, which are provided in the first memory chip M1, and two test pads TP1a and TP1b are shown. The surface bump 171a and the test pad TP1a are short-circuited. The surface bump 171b and the test pad TP1b are short-circuited. A signal supplied to the test pad TP1a or the surface bump 171a is supplied to the internal circuit 220 (access control circuit 221) of the second memory chip M2. A signal supplied to the test pad TP1b or the surface bump 171b is supplied to the internal circuit 220 (access control circuit 221) of the first memory chip M1. Therefore, if the input signal is a signal designed to activate the chip, such as a chip select signal, the first memory chip M1 and the second memory chip M2 can be selectively activated.

Figure 6:
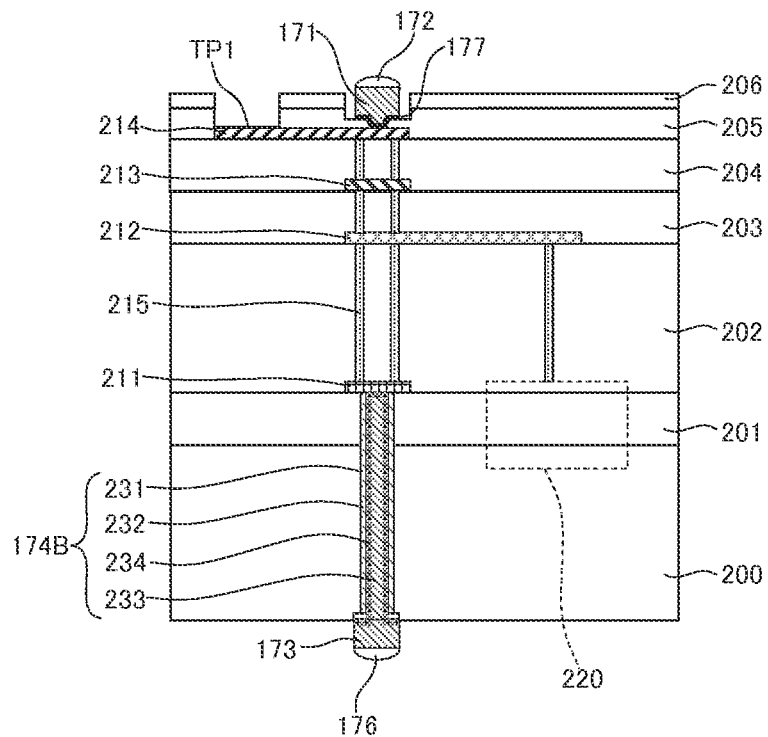
FIG. 6 is a schematic cross-sectional view indicative of an embodiment of the structure of a through-type (through routing) through electrode 174B, among the through electrodes 174 provided in the first memory chip M1.
Figure 7:
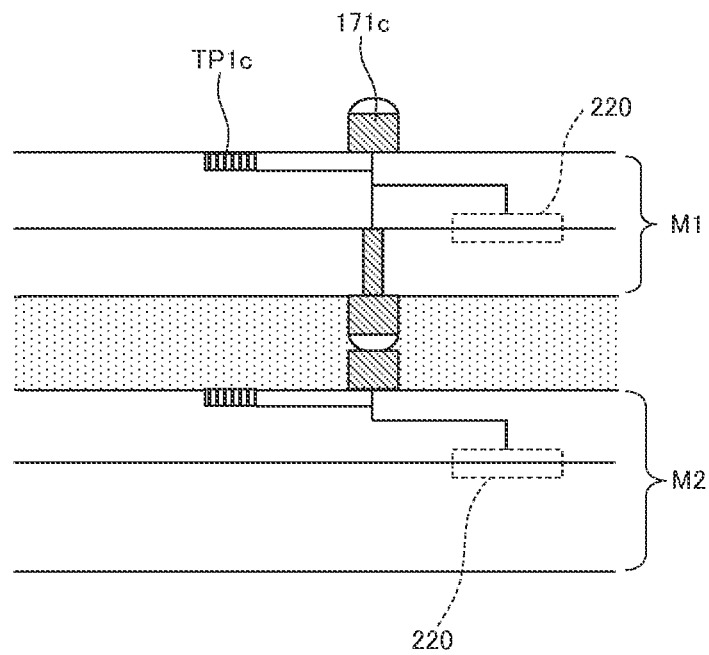
FIG. 7 is a schematic diagram indicative of an embodiment of the electrical connection relationship of the through-type through electrode 174B.

Turning to FIGS. 6 and 7, through the through-type through electrode 174B, the surface bump 171 and back-surface bump 173 that are formed and arranged in the longitudinal direction are electrically connected. The rest of the configuration is identical to that of the above-described staggered type. Therefore, the same components are represented by the same reference symbols, and will not described again. According to this configuration, as shown in FIG. 7, a signal that is input from a test pad TP1c or a surface bump 171c is supplied to both the internal circuit 220 of the first memory chip M1 and the internal circuit 220 of the second memory chip M2.

The configuration of the first memory chip M1 has been described. The second memory chip M2 has the same configuration as that of the first memory chip M1 except that the second memory chip M2 does not include the through substrate via 231, the via insulation film 232, the plating seed layer 234, the through-substrate conductor 233, the back-surface bump 173, and the solder layer 176.

Figure 8:
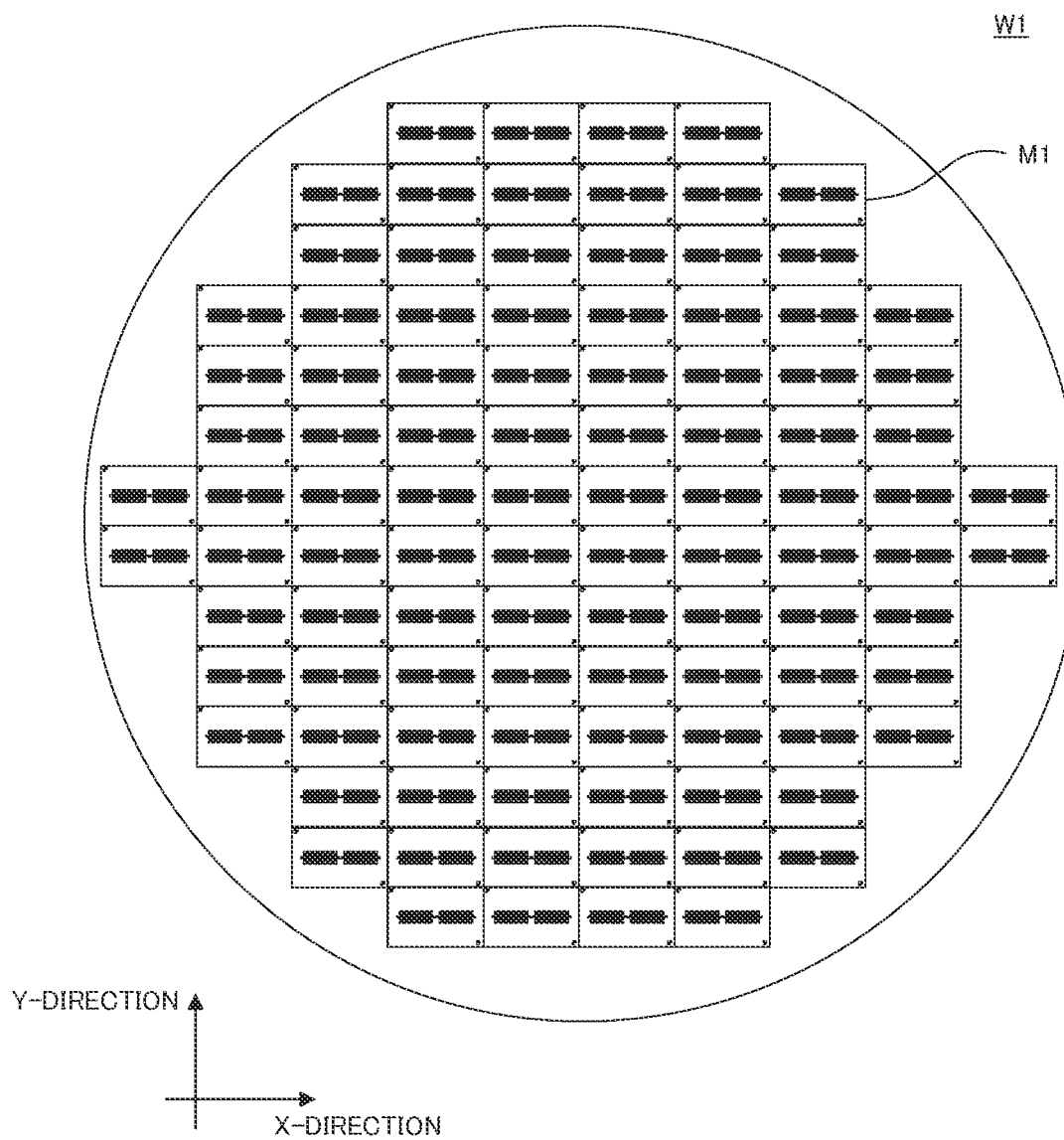
FIG. 8 is a plane view indicative of an embodiment of a wafer W1.

Turning to FIG. 8, a large number of first memory chips M1 are formed in a matrix form in x- and y-directions on a wafer (an additional semiconductor wafer, a first semiconductor wafer) W1. Incidentally, the base wafer W2 has the same configuration as that of the wafer W1 shown in FIG. 8. Accordingly, the wafer W1 and the base wafer W2 can be manufactured in the same process.

Figure 9B:
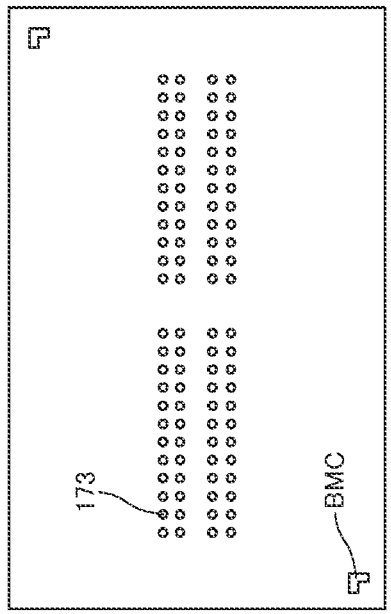
FIG. 9B is a view indicative of the first memory chip M1 when seen from the back surface side thereof.
Figure 9A:
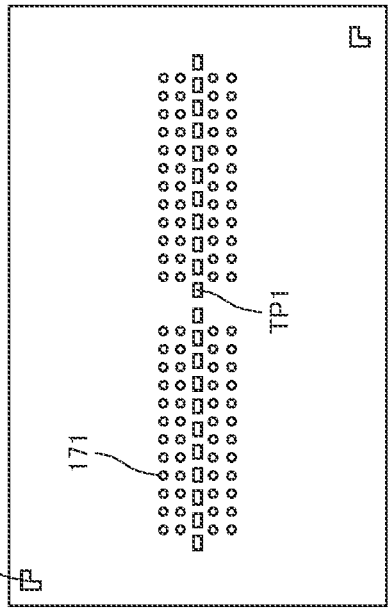
FIG. 9A is a plane view indicative of the first memory chip M1 when seen from the top surface side thereof.

Turning to FIG. 9A, a large number of surface bumps 171 and test pads TP1 are formed on the top surface side of the first memory chip M1. A region in which the surface bumps 171 are arranged is divided into four regions. That is, the region is divided into two regions in a substantially central portion of x-direction. Furthermore, each of the two regions is divided into two regions in a substantially central portion of y-direction. The four regions correspond to channels ChA to ChD shown in FIG. 11.

The test pads TP1 are arranged in a line in x-direction. The test pads TP1 are arranged in a region dividing the surface bumps 171 into the two regions in the y-direction.

As shown in FIG. 9A, at diagonally opposite corners that are paired, surface alignment marks FMC are placed. The surface alignment marks FMC shown in FIG. 9A are in a L-shape. However, the shape of the surface alignment marks FMC is not limited to this. The surface alignment marks FMC are formed as the fourth wiring layer 214 shown in FIGS. 4 and 6. Incidentally, the surface of the second memory chip M2 has the same configuration as that of the surface of the first memory chip M1 shown in FIG. 9A.

Turning to FIG. 9B, on the back surface side of the first memory chip M1, back-surface bumps 173 are formed in such a way as to overlap with the surface bumps 171 when seen in planar view. At diagonally opposite corners that are paired, back-surface alignment marks BMC are placed. The back-surface alignment marks BMC may be formed at the same corners where the surface alignment marks FMC are formed, or at different corners. The back-surface alignment marks BMC are formed as the through-substrate conductors 233 and back-surface bumps 173 shown in FIGS. 4 and 6. Incidentally, the second memory chip M2 does not include the back-surface bumps 173 and the back-surface alignment marks BMC.

The surface alignment marks FMC and the back-surface alignment marks BMC are used when the first memory chips M1 are stacked on the second memory chips M2 formed on the base wafer W2. The alignment marks FMC and BMC make it possible to accurately stack the first memory chips M1 on the second memory chips M2.

Figure 10:
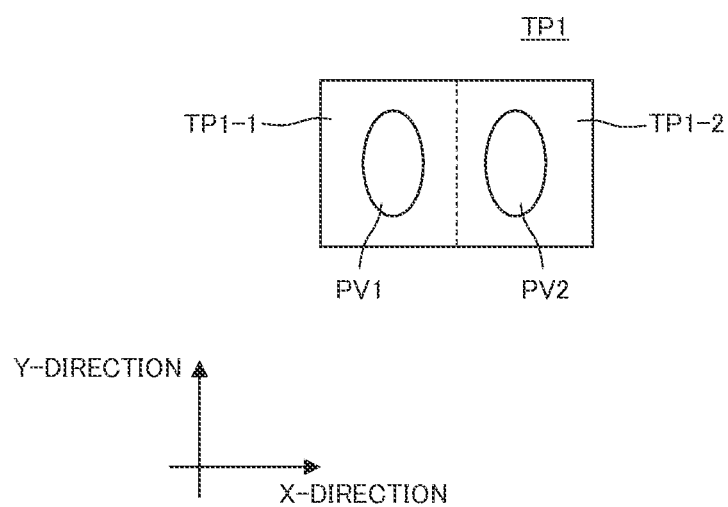
FIG. 10 is a plane view indicative of an embodiment of the shape of a test pad TP1.

Turning to FIG. 10, the test pad TP1 includes two probe areas, or a wafer test probe area TP1-1 and a stacking test probe area TP1-2. The size of each probe area is large enough to contact a probe of a probe card described later. As described later, the present invention may employ a process flow by which the surface bumps 171 are formed after a pre-stacking test (a wafer test, a second test operation) is performed. In this case, however, there is a possibility that a probe scar that is formed on the test pad TP1 during the wafer test is expanded during a wet etching process during which the surface bumps are formed to form a hole. That hole could reach not only the test pad TP1 but also lower wiring layers, such as the third wiring layer 213 and the second wiring layer 212. When a post-stacking test (a stacking test, a first test operation) is performed, the test may not be properly performed.

According to the present embodiment, as described above, on the test pad TP1, the two probe areas, or the wafer test probe area (a firs probe area) TP1-1 and the stacking test probe area (a second probe area) TP1-2, are formed to solve that problem. That is, when the wafer test is performed, probing is performed through the wafer test probe area TP1-1. When the stacking test is performed, probing is performed through the stacking test probe area TP1-2. In this manner, the probing can be performed twice on the same test pad TP1. Incidentally, the marks indicated by reference symbols PV1 and PV2 in FIG. 10 are the probe scars caused by probing during the wafer test and the stacking test.

Test pads (second pad electrodes) TP2 provided on the second memory chip M2 have the same configuration. However, as described later, the stacking test for the second memory chip M2 is performed through the first memory chip M1 that is stacked thereon.

Figure 11:
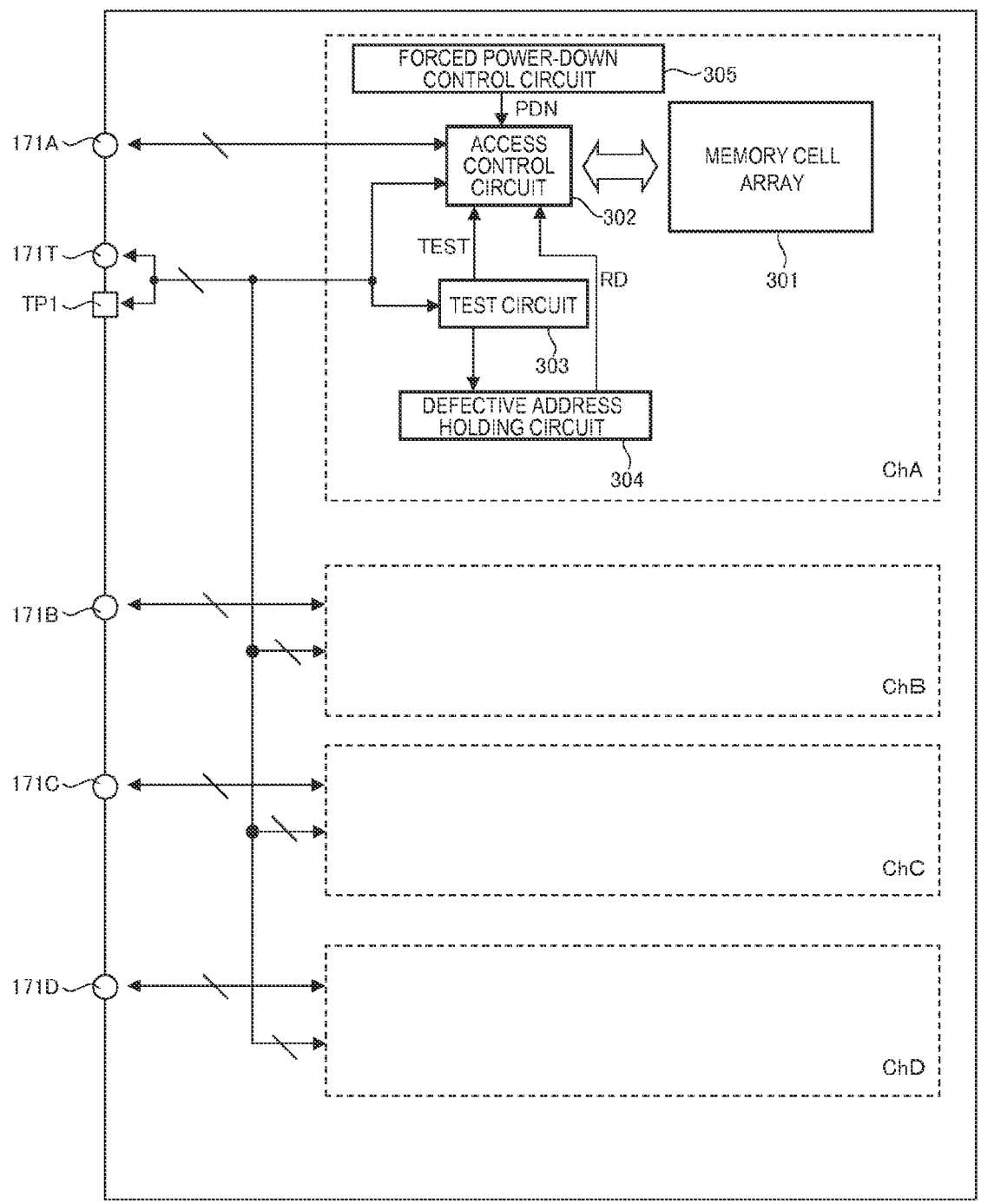
FIG. 11 is a block diagram indicative of an embodiment of the circuit configuration of the first memory chip M1.

Turning to FIG. 11, the first memory chip M1 is Wide-IO DRAM as described above, and the first memory chip M1 includes four channels ChA to ChD, each of which works as a single DRAM. In the first memory chip M1, surface bumps 171A to 171D for normal access are provided for the channels ChA to ChD, respectively.

Incidentally, as for the normal-access surface bumps 171A to 171D, only one bump is shown in FIG. 11 for each. In fact, a plurality of normal-access surface bumps 171A to 171D are respectively provided for each of the channels ChA to ChD. More specifically, the normal-access surface bumps 171A to 171D each includes a plurality of command address bumps to which command address signals are supplied; a clock bump, to which a clock signal is supplied; a chip select bump to which a chip select signal is supplied; a clock enable bump to which a clock enable signal is supplied; and a DQ bump, which is used for inputting and outputting of data. Of those bumps, the chip select bump and the clock enable bump are connected to the staggered-type through electrodes shown in FIGS. 4 and 5. The other bumps are connected to the through-type through electrodes shown in FIGS. 6 and 7.

As shown in FIG. 11, a test surface bump 171T and a test pad TP1 are provided so as to be shared by the channels ChA to ChD. FIG. 11 shows only one test surface bump 171T. However, a plurality of test surface bumps 171T are in fact provided. More specifically, the test surface bumps 171T include a plurality of test command address bumps to which test command address signals are supplied; a test clock bump, to which a test clock signal is supplied; a test chip select bump to which a test chip select signal is supplied; a test clock enable bump, to which a test clock enable signal is supplied; and a test DQ bump, which is used for inputting and outputting of test data. Of those bumps, the test chip select bump and the test clock enable bump are connected to the staggered-type through electrodes shown in FIGS. 4 and 5. The other test surface bumps 171T are connected to the through-type through electrodes shown in FIGS. 6 and 7.

FIG. 11 shows only one test pad TP1. However, a plurality of test pads TP1 are in fact provided. More specifically, the test pads TP1 include a plurality of test command address pads to which test command address signals are supplied; a test clock pad to which a test clock signal is supplied; a test chip select pad to which a test chip select signal is supplied; a test clock enable pad to which a test clock enable signal is supplied; and a test DQ pad which are is for inputting and outputting of test data.

The test surface bump 171T and test pad TP1 that input or output the same signal are electrically connected to each other.

The configuration of the channels ChA to ChD will be described. The channels ChA to ChD have the same configuration. Accordingly, the channel ChA will be described as an example.

As shown in FIG. 11, the channel ChA includes a memory cell array 301 and an access control circuit 302 which accesses the memory cell array 301. The access control circuit 302 accesses the memory cell array 301 in response to a command address signal to read or write data. The channel ChA also includes a test circuit 303. In response to a test control signal TEST output from the test circuit 303, the access control circuit 302 performs various operations during a test.

Furthermore, the channel ChA includes a defective address holding circuit 304. If an address specified is defective, the access control circuit 302 then accesses a redundant memory cell in accordance with defective address information RD supplied from the defective address holding circuit 304. When a forced power-down entry signal PDN is supplied from a forced power-down control circuit 305, the access control circuit 302 operates in a well-known power down mode (low power consumption mode).

The test circuit 303 supplies, to the access control circuit 302, a test control signal TEST, which indicates the execution of various test operations, in response to various test signals. Incidentally, in the example shown in FIG. 11, the test circuit 303 is placed in each channel. However, a part of the test circuit 303 may be shared by the channels ChA to ChD.

The defective address holding circuit 304 is a circuit that holds addresses of defective memory cells. More specifically, the defective address holding circuit 304 includes a plurality of anti-fuse elements that are programmed to store defective addresses.

If the memory chip is defective, the forced power-down control circuit 305 supplies a forced power-down entry signal PDN to the access control circuit 302. More specifically, the forced power-down control circuit 305 contains an anti-fuse element. If the anti-fuse element is programmed, the forced power-down entry signal PDN is activated. Incidentally, instead of providing the forced power-down control circuit 305 for each channel, the forced power-down control circuit 305 may be provided so as to be shared by the channels.

Figure 12:
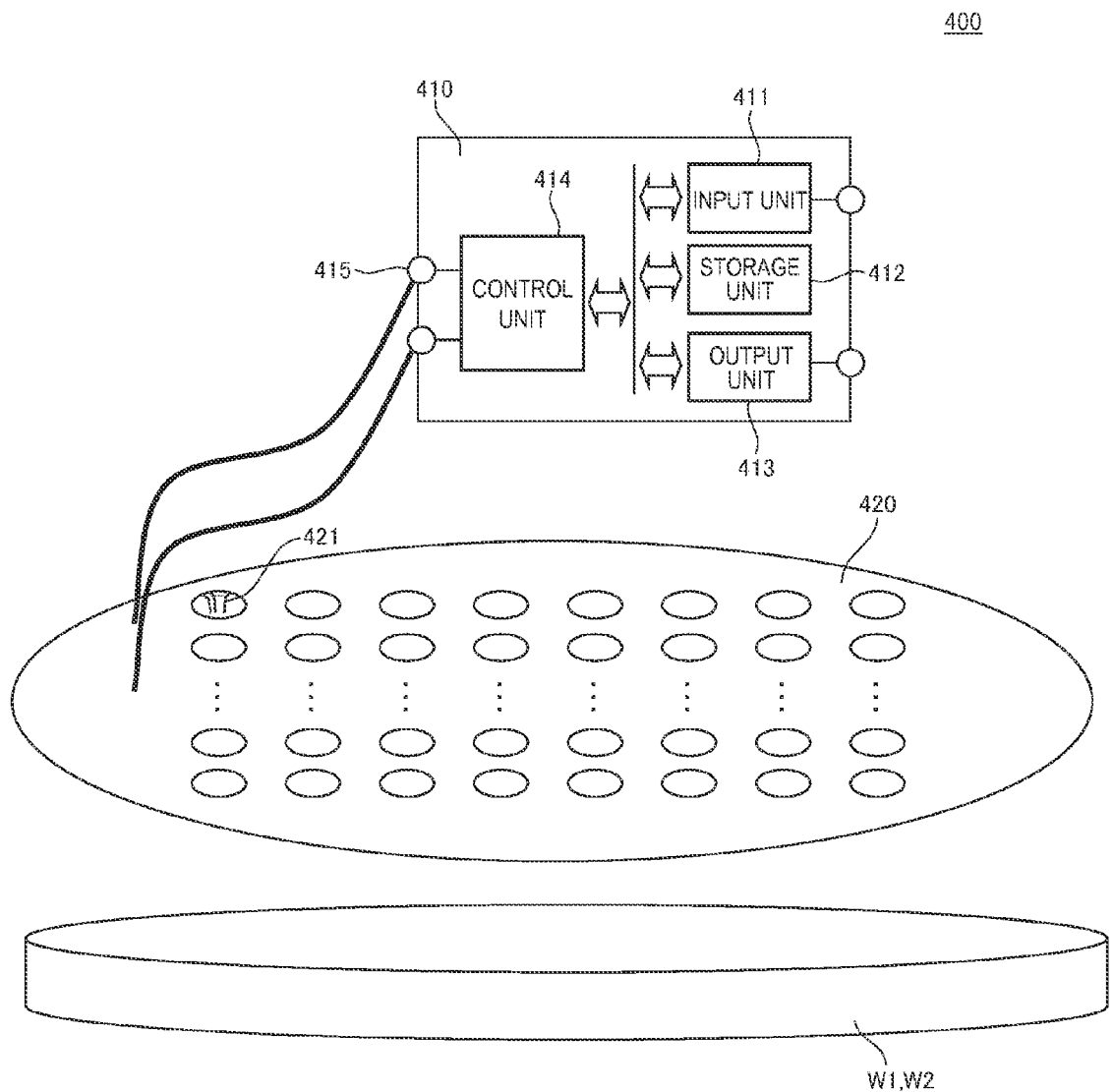
FIG. 12 is a schematic diagram indicative of an embodiment of the configuration of a wafer test system 400.

Turning to FIG. 12, the wafer test system 400 includes a tester 410 and a probe card 420.

In response to control information that is input from outside via an input circuit 411, and a software program that is stored in advance in a storage circuit 412, the tester 410 supplies various test signals generated by a control circuit 414 to the probe card 420 via input/output ports 415. Moreover, the tester 410 receives the results of tests supplied from the probe card 420 via the input/output ports 415, and outputs the results to the outside via the control circuit 414 and an output circuit 413.

Figure 13:
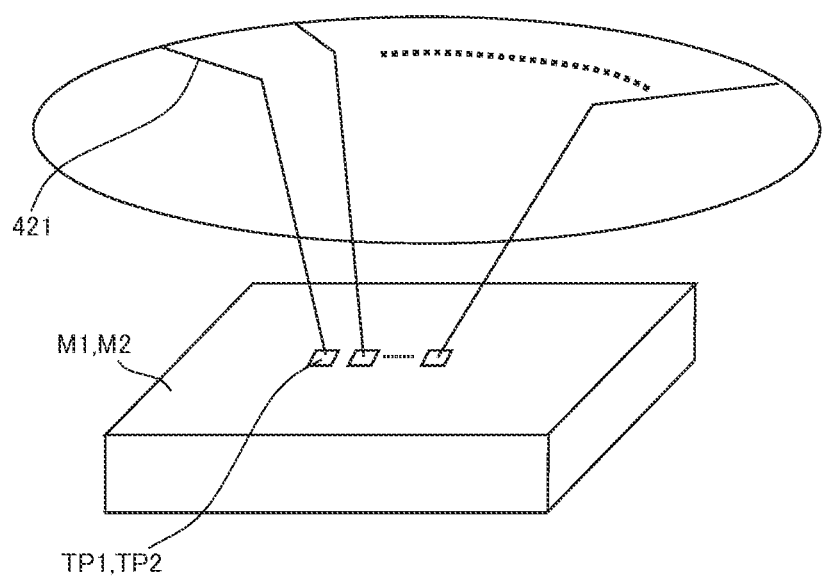
FIG. 13 is a schematic diagram indicative of an embodiment of the configuration of a probe card 420.

The probe card 420 is a circuit board to which a plurality of probes 421 are connected. Various test signals coming from the tester 410 are supplied to test-target memory chips M1 and M2 on the wafers W1 and W2 via the probes 421, and the results of tests coming from the test-target memory chips M1 and M2 are supplied to the tester 410. When a test actually is performed, as shown in FIG. 13, the probes 421 provided on the probe card 420 come in contact with the test pads TP1 and TP2 of the memory chips M1 and M2, and the test signals are input and output.

The number of probes 421 provided on the probe card 420 is not specifically limited. For example, the number of probes 421 provided on the probe card 420 is set in such a way as to be able to test all the memory chips M1 on the wafer W1 at once. Alternatively the number of probes 421 provided on the probe card 420 may be set in such a way as to be able to test half of the memory chips M1 on the wafer W1 at once, and the entire region of one wafer W1 may be tested by performing touch-down (or an operation of putting needles onto the test pads TP1) twice.

The positions of the probes 421 provided on the probe card 420 are accurately designed so that the positions of the probes 421 are aligned with the positions of a plurality of test pads TP1 of a plurality of first memory chips M1 on the wafer W1. While the details will be described later, in the first embodiment, the stacking test that is performed after the stacking is performed in a situation (chip-on-wafer stacked structure) where the first memory chips M1 are stacked on the second memory chips M2 in a the wafer state (base wafer). In the second embodiment, the stacking test that is performed after the stacking is performed in a situation (wafer-on-wafer stacked structure) where the first memory chips M1 in a the wafer state (stacked wafer) are stacked on the second memory chips M2 similarly in a wafer state (base wafer). In the case of the chip-on-wafer stacked structure and the wafer-on-wafer stacked structure, the first memory chip M1 and the second memory chip M2 can be stacked in such a way that the positions of the first memory chips M1 are accurately aligned with the positions of the corresponding second memory chips M2. Therefore, the positions of the test pads TP1 of the first memory chip M1 in the chip-on-wafer stack or the wafer-on-wafer stack are accurately aligned with the positions of the test pads TP1 and TP2 of the single first memory chip M1 in a wafer state and the single second memory chip M2 in a wafer state. This means that the positions of the test pads TP1 of the first memory chip M1 in the chip-on-wafer stacked structure or the wafer-on-wafer stacked structure are accurately aligned with the positions of the probes 421 of the probe card 420.

As the probe card 420, various probe cards are available, including probe cards of a cantilever type, a blade type, a MEMS type, and a thin-film type.

Figure 15A:
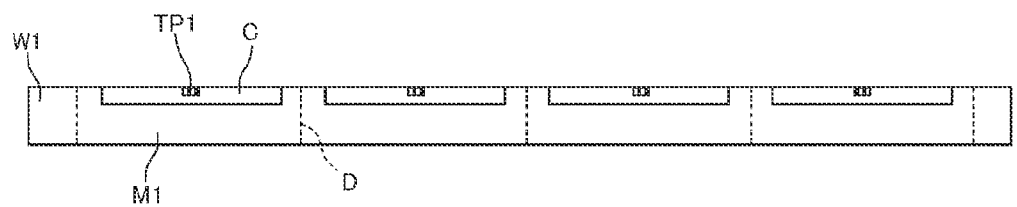
FIGS. 15A to 16D are schematic cross-sectional views indicative of process of a method for manufacturing the first memory chips M1.

Turning to FIG. 15A, in the manufacturing method of the first memory chips M1, at a so-called front-end process, a circuit layer C containing an internal circuit and a multilevel wiring structure is formed on a main surface of a wafer W1 (step S10). The wafer W1 is a disk-shaped substrate (see FIG. 8) made of silicon or the like, and is about 800 μm in thickness, for example. In the wafer W1, a plurality of chip regions are defined by dicing lines D. In each chip region, a first memory chip M1 is formed. The configuration of the first memory chip M1 has already been described above. The first memory chip M1 includes an internal circuit that works as Wide-IO DRAM as shown in FIG. 11. At this step, a test pad TP1 is formed, too.

Figure 15B:
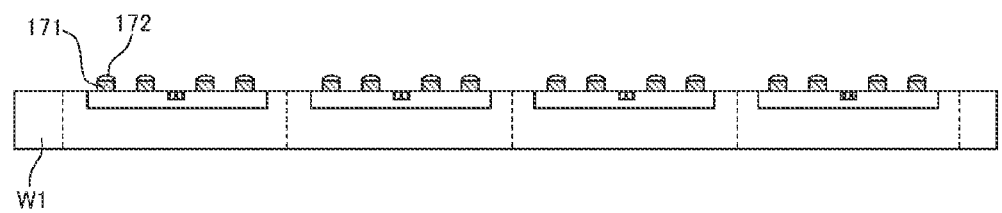

Turning to FIG. 15B, on an exposed fourth wiring layer 214 (see FIG. 4), surface bumps 171 and a solder layer 172 are formed (step S11). First a plating seed layer is formed by sputtering to form the surface bumps 171. The plating seed layer may adopt a two-layer structure that is made up of a lower-layer barrier metal made of titanium (Ti) and an upper-layer plating seed made of copper (Cu), for example. Then, electrolytic plating is performed to form a Cu film, thereby forming copper posts. Moreover, electrolytic plating is performed on the upper surfaces of the copper posts to form a Ni layer. Furthermore, electrolytic plating is performed on the upper surface of the Ni layer to form an Au layer. As a result, the surface bumps 171 are formed. Furthermore, electrolytic plating is performed on the upper surface of the Au layer of the surface bumps 171 to form a solder layer 172 made of a Sn—Ag alloy.

Figure 15C:
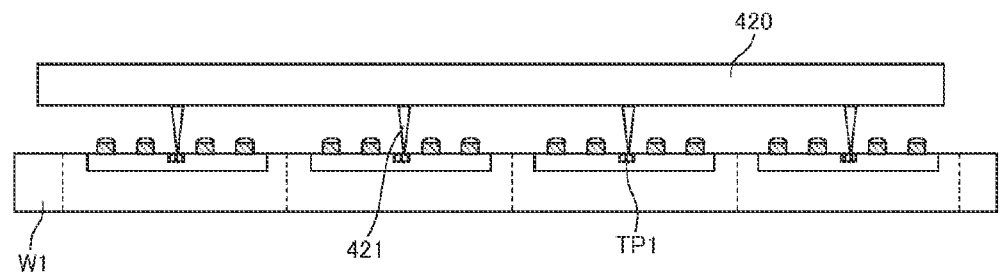

Turning to FIG. 15C, the probe card 420 is used to perform a wafer test (step S12). The wafer test is performed by the wafer test system 400 shown in FIG. 12. The wafer test will be detailed later with reference to FIG. 23. According to the present embodiment, test items of the wafer test is far fewer than test items of the stacking test described later. Accordingly, the chips that are judged to be defective by the wafer test are unrecoverable chips, such as those affected by a large-current failure, an all-cell failure, a large-block failure, and the like.

Figure 14:
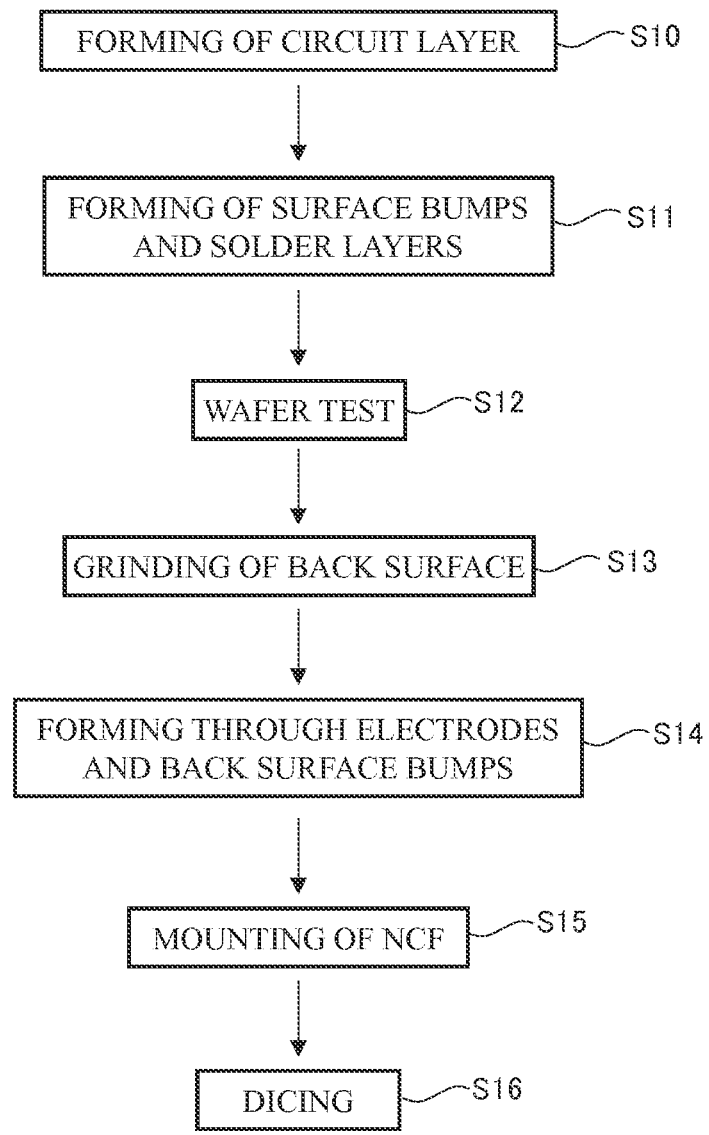
FIG. 14 is a flowchart indicative of an embodiment of a manufacturing process of the first memory chips M1.

Incidentally, step S12 may be performed before step S11. However, as shown in FIG. 14, if the surface bumps 171 and the solder layer 172 are formed (step S11) before the wafer test (step S12), there are no probe scars when the surface bumps 171 are formed; no serious damage is therefore inflicted on the test pads TP1 when the plating seed layer used for the formation of the surface bumps 171 is removed by wet etching. If step S12 is performed prior to step S11, when the surface bumps 171 are formed, there are probe scars. Accordingly, the probe scars may be expanded during the above-mentioned wet etching, and holes may be formed in the test pads TP1. However, according to the present embodiment, even if the holes are formed in the test pads TP1, as described above, the first and second probe areas TP1-1 and TP1-2 are provided in the test pads TP1. Therefore, even if the holes are formed in the first probe areas TP1-1, the second probe areas TP1-2 can be used to perform the stacking test described later.

Figure 15D:
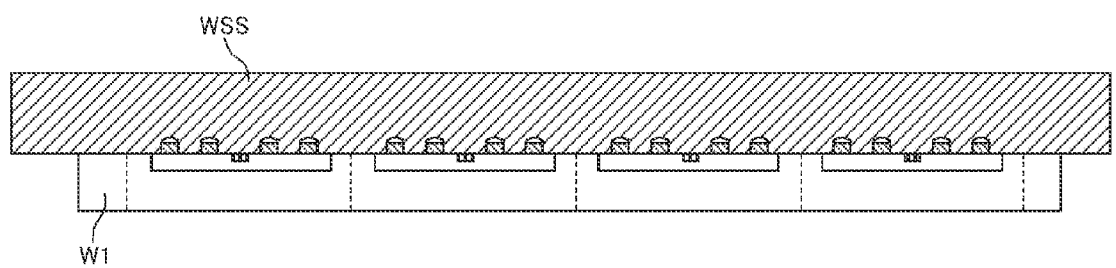
Figure 15E:
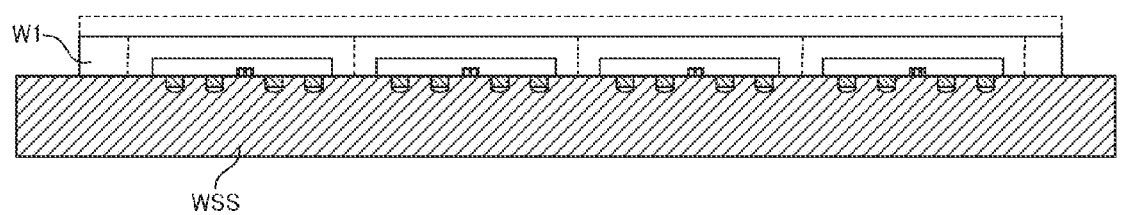

After the wafer test is ended, the back surface of the wafer W1 is ground to reduce the thickness thereof (step S13). At this step, first, as shown in FIG. 15D, a wafer support system WSS is attached to the main surface of the wafer W1 to protect the main surface and improve the handling ability. The wafer support system WSS is made of a glass substrate, for example; the wafer support system WSS is bonded to the wafer W1 through an adhesive layer. The adhesive layer may be an UV tape, for example, whose adhesiveness is reduced by UV irradiation. After the wafer support system WSS is attached as shown in FIG. 15E, the back surface of the wafer W1 is ground by a back surface grinding device until the thickness of the wafer W1 is reduced to about 50 μm, for example.

Figure 16A:
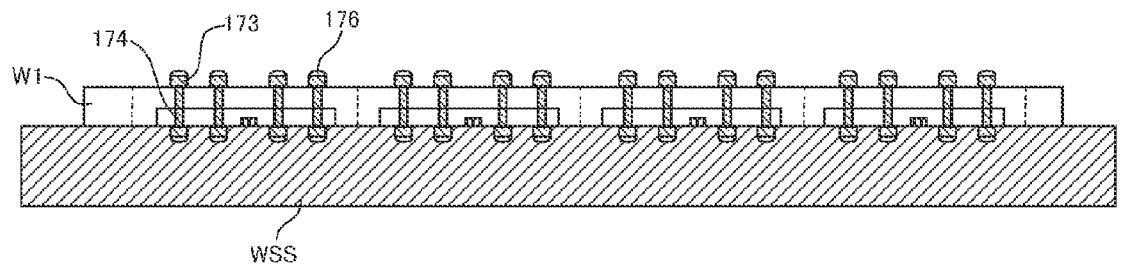

Turning to FIG. 16A, on the wafer W1, through electrodes 174, back-surface bumps 173, and a solder layer 176 are formed (step S14). At this step, first, the wafer W1 is selectively etched from the back surface side thereof, thereby forming through substrate vias 231. Then, a via insulation film 232 made of silicon oxide film or the like is formed on the inner sidewalls of the through substrate vias 231 and portions of the back surface (where the back-surface bumps are formed). The via insulation film 232 can be formed by CVD method, for example. After that, the bottom portions of the through substrate vias 231 and the via insulation film 232 formed in unnecessary portions of the back surface are removed by etching. Then, a plating seed layer 234 is formed by sputtering. The plating seed layer 234 may adopt a two-layer structure that is made up of a lower-layer barrier metal made of titanium (Ti) and an upper-layer plating seed made of copper (Cu), for example. Then, electrolytic plating is performed to form through-substrate conductors 233 and back-surface bumps 173. Moreover, electrolytic plating is performed on the upper surfaces of the back-surface bumps 173 to form a solder layer 176 made of a Sn—Ag alloy or the like.

Figure 16B:
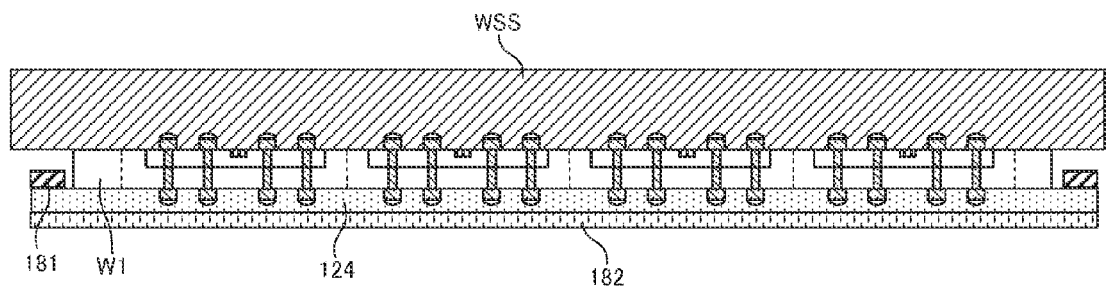

Turning to FIG. 16B, a filler 124 made of NCF or the like is mounted (step S15). At this step, a ring-shaped jig 181 is used to stretch a dicing tape 182 and the filler 124, which is made of NCF or the like, in a disc shape. The stretched filler 124 is attached to the back surface of the wafer W1.

Figure 16C:
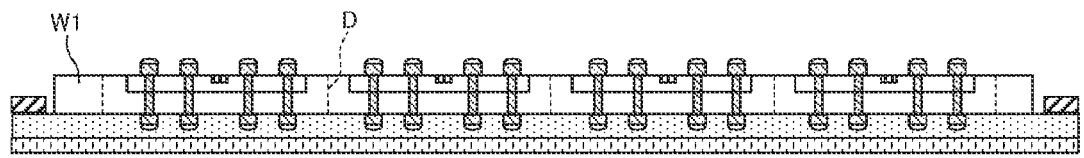
Figure 16D:
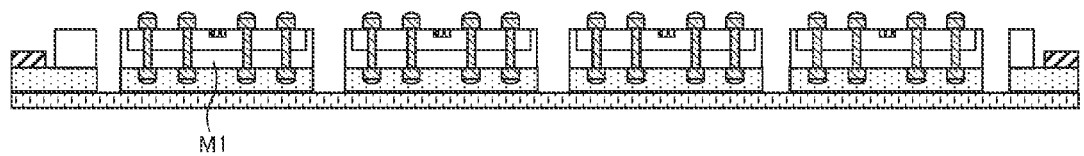

Turning to FIG. 16C, the wafer support system WSS and the adhesive layer are removed by UV irradiation or the like. Turning to FIG. 16D, dicing (singulating) of the wafer W1 is performed by a dicing device. As a result, the first memory chips M1 can be separately taken out (step S16).

By the above-described steps, a plurality of singulated first memory chips M1 can be produced.

Figure 17:
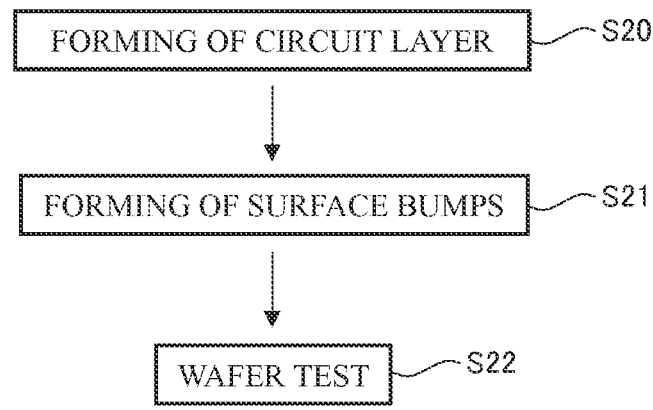
FIG. 17 is a flowchart indicative of an embodiment of a manufacturing process of the second memory chips M2.

Turning to FIG. 17, the manufacturing process of the second memory chips M2 is almost identical to the manufacturing process of the first memory chips M1 except that steps S13 to S16 shown in FIG. 14 are omitted. That is, a circuit layer Cis formed on a main surface of a wafer W2 (step S20). Surface bumps 171 are formed on a fourth wiring layer 214 (step S21). Then, a wafer test is performed (step S22). As a result, a plurality of second memory chips M2 are completed on the wafer. In this case, step S22 may be performed before step S21.

Figure 18:
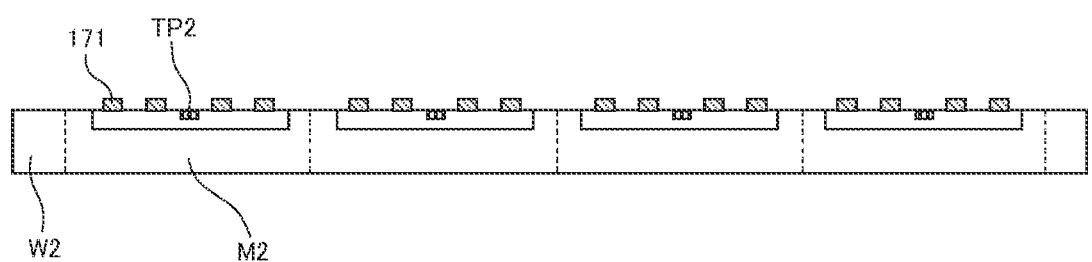
FIG. 18 is a schematic cross-sectional view indicative of one process of a method for manufacturing the second memory chips M2.
Figure 19:
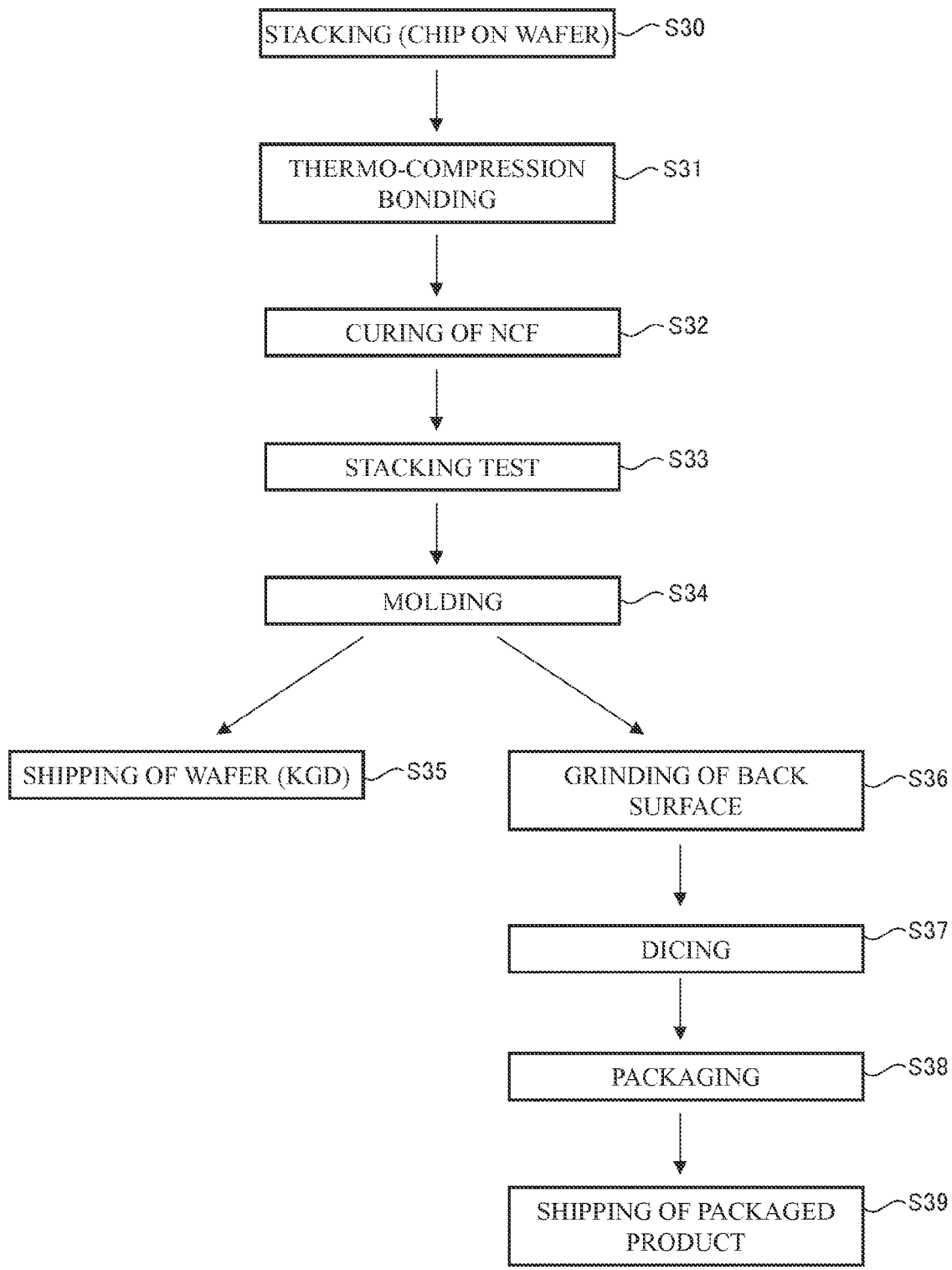
FIG. 19 is a flowchart indicative of an embodiment of a manufacturing process of a chip stacked structure SC according to a first embodiment.

Incidentally, in the manufacturing process of the second memory chips M2, as shown in FIG. 18, there is no need to form a solder layer 172 on the surface bumps 171.

Figure 20A:
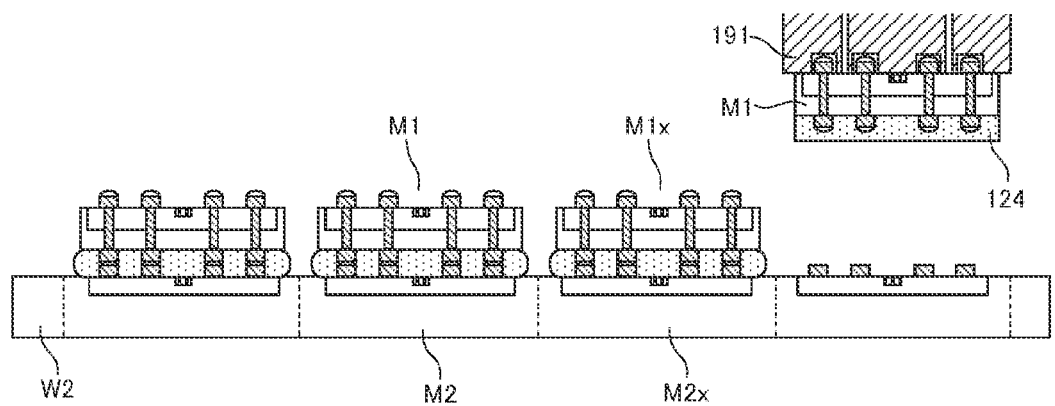
FIGS. 20A to 21D are schematic cross-sectional views indicative of process of the method for manufacturing the chip stacked structure SC.

In the manufacturing method of the stacked structure SC, first, as shown in FIG. 20A, the singulated first memory chips M1 are stacked on the base wafer W2 in which a plurality of second memory chips M2 are formed (stacking) (step S30). The back surface of the base wafer W2 is sorbed to and held by a stage of a flip-chip bonding device (not shown).

The alignment marks FMC and BMC shown in FIG. 9 are used to align the positions of the second memory chips M2 with the positions of the first memory chips M1. More specifically, the surface alignment marks FMC of the second memory chips M2 on the base wafer W2 are recognized by a camera (not shown) to determine the positions (coordinates) of the second memory chips M2. Meanwhile, the back-surface alignment marks BMC of the first memory chip M1 sorbed to a mounting tool 191 are recognized by a camera (not shown) to determine the positions (coordinates) of the first memory chips M1. Then, the first memory chip M1 is moved by the mounting tool 191 in such a way that the coordinates of the second memory chip M2 match the coordinates of the first memory chip M1. In this manner, the second memory chips M2 and the first memory chips M1 can be accurately stacked. When the stacking is performed, flux is preferably applied to the tips of the back-surface bumps 173 of the first memory chip M1.

If the wafer test has already detected that there is a defective second memory chip M2x in the base wafer W2, as shown in FIG. 20A, it is preferred that a defective first memory chip M1x detected by the wafer test be put on the defective second memory chip M2x. In this manner, the defective first memory chip M1x is stacked on the defective second memory chip M2x in the base wafer W2. Therefore, it is possible to avoid stacking wastefully the non-defective first memory chips M1, and to make the stacked structures SC equal in height to one another.

Figure 22A:
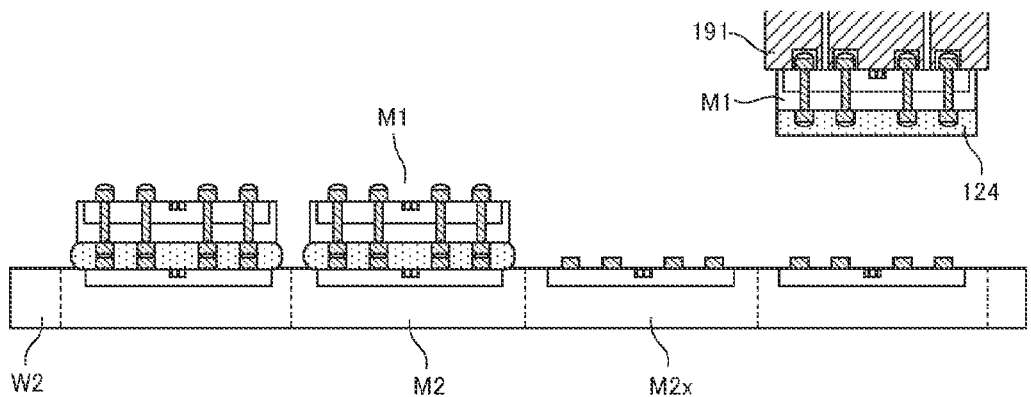
FIGS. 22A to 22C are schematic cross-sectional views indicative of process of a method for manufacturing a chip stacked structure SC according to a modification of the first embodiment.

Alternatively, as shown in FIG. 22A which shows a modified example, neither the first memory chip M1 nor M1x may be mounted on the defective second memory chip M2x.

Figure 22B:
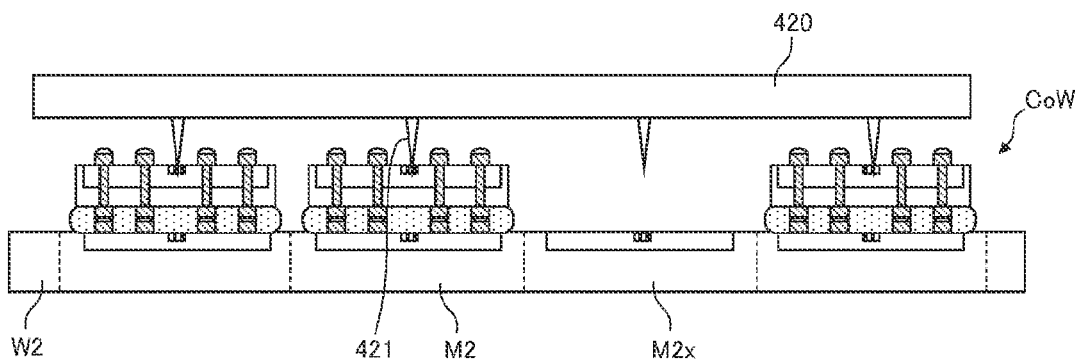

The defective first memory chip M1x and the defective second memory chip M2x are forced into a power-down mode as a result of programming the anti-fuses of the forced power-down control circuit 305 shown in FIG. 11 during the wafer test. This means that, during the stacking test described later, even as the probes come in contact with the defective stacked structure SCx containing the first and second memory chips M1x and M2x or with the defective second memory chip M2x (see FIGS. 20C and 22B), this configuration is designed not to affect tests on other non-defective stacked structures SC by blocking a large current from flowing via the defective first memory chip M1x and/or the defective second memory chip M2x, for example. Hereinafter, the base wafer W2 on which a plurality of first memory chips M1 are mounted is also referred to as a chip-on-wafer stacked structure CoW.

Figure 20B:
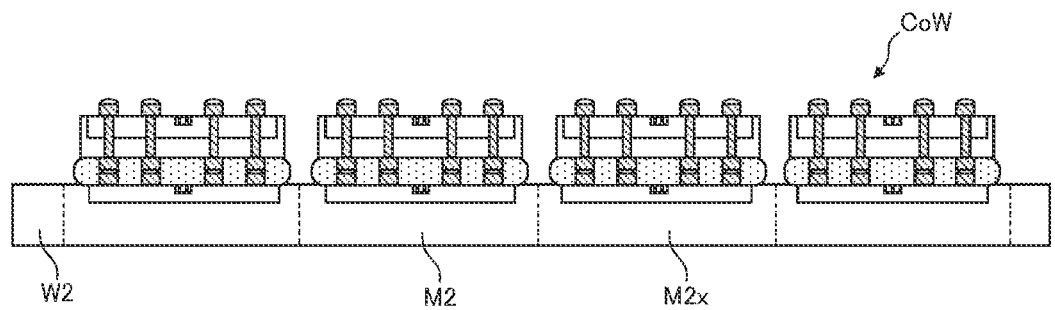

Then, as shown in FIG. 20B, thermo-compression bonding of the chip-on-wafer stacked structure CoW is performed under heating and pressurizing conditions, and the back surface bumps 173 of the first memory chips M1 are bonded to the surface bumps 171 of the corresponding second memory chips M2 as a result (step S31). Then, under heating conditions, the filler 124 made of NCF or the like is solidified (or cured) (step S32).

Figure 20C:
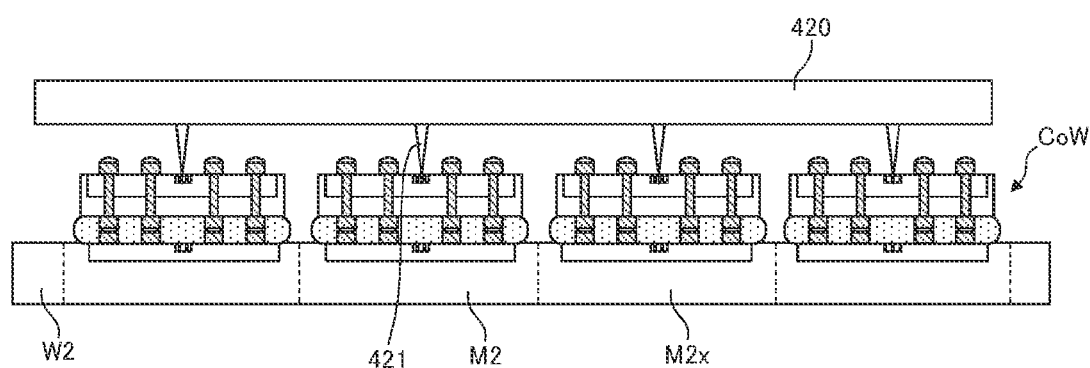

Then, as shown in FIG. 20C, the wafer test system 400 shown in FIG. 12 is used to perform the stacking test on both the first memory chips M1 and the second memory chips M2 (step S33). The details of the test will be described later with reference to FIG. 23.

In the stacking test, probing is performed with the probes 421 of the probe card 420 on the test pads TP1 of the first memory chip M1. That is, the probing is performed for the first memory chips M1 which are positioned on the upper side of the stacked structures SC that constitute the chip-on-wafer stacked structure CoW and which have the exposed test pads TP1. The probing is not performed for the second memory chips M2 which are positioned on the lower side of the stacked structures SC and which have the covered test pads TP2. One of the features of the present embodiment is that, in this state, or for the chip-on-wafer stacked structure CoW, by putting the needles onto the test pads TP1 of the first memory chips M1, both the first memory chips M1 and the second memory chips M2 are tested.

As described above, the test pads TP1 of the first memory chips M1 are respectively connected to the corresponding test surface bumps 171T and the through electrodes 174 that are connected to the surface bumps 171T. Accordingly, the test pads TP1 of the first memory chips M1 are electrically connected to the surface bumps 171T of the second memory chips M2 via the through electrodes 174 formed on the first memory chips M1, respectively. As described above, because a test chip select signal is supplied via the staggered-type through electrodes 174A, it is possible to separately access the stacked first memory chips M1 and second memory chips M2. Therefore, the test on the first memory chips M1 can be performed separately from the test on the second memory chips M2. However, the tests on the first memory chips M1 and the second memory chips M2 are preferably performed in such a way that the test periods at least partially overlap with each other. In this manner, if the test periods for the first memory chips M1 and the second memory chips M2 at least partially overlap with each other, the test time can be reduced compared with the case where the tests on the first memory chips M1 and the second memory chips M2 are separately performed without overlapping each other.

Figure 20D:
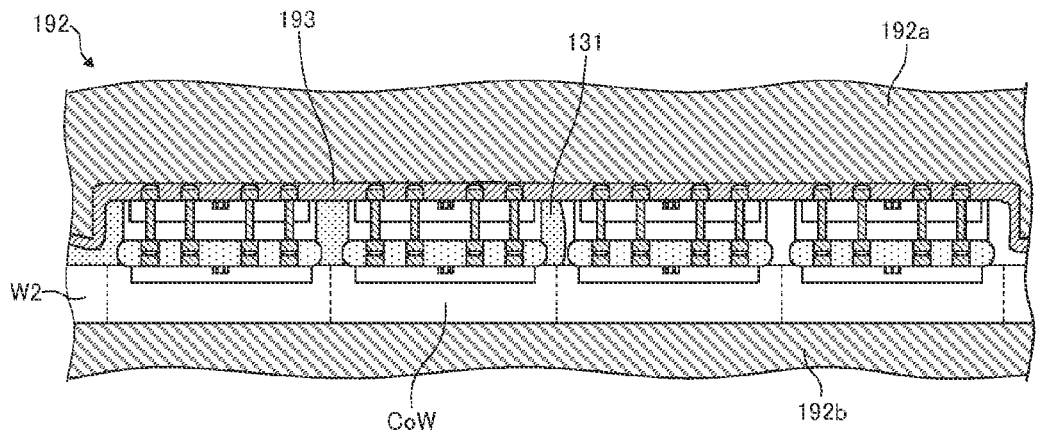

Then, as shown in FIG. 20D, a molding device 192 is used to perform molding of the chip-on-wafer stacked structure CoW with sealing resin 131 (step S34). The molding device 192 includes a mold made up of an upper mold 192a and a lower mold 192b. During this process, first, the chip-on-wafer stacked structure that has undergone the stacking test is set in the lower mold 192b. As the upper die 192a is put on the lower mold 192b, a cavity of a predetermined size and a gate portion are formed above the base wafer W2. The cavity is formed in such a way as to cover a plurality of first memory chips M1 at once. Moreover, in the upper mold 192a, a sheet material 193 of a predetermined thickness is disposed. As the molds are completely put together, the sheet material 193 is closely attached to the surfaces of the first memory chips M1. Then, to a pot (not shown) of the lower mold 192b, resin tablets are supplied and then heated and melted. The melted sealing resin 131 is injected into the cavity via the gate portion by a plunger (not shown). After the cavity is filled with the sealing resin 131, the sealing resin 131 is cured at 180 degrees Celsius, for example. In this manner, the sealing resin 131 is cured, and the cured sealing resin 131 is formed on the surface of the base wafer W2.

Figure 20E:
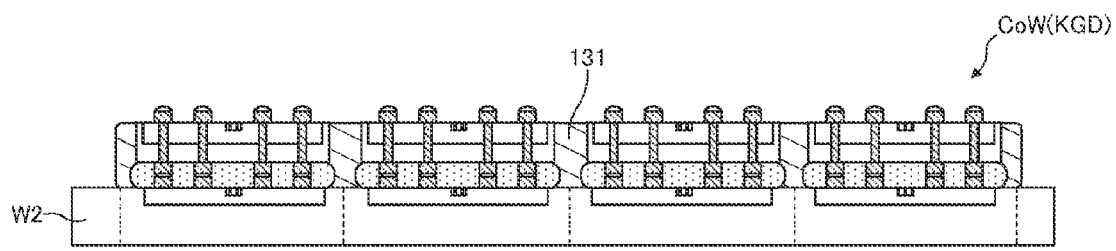
Figure 22C:
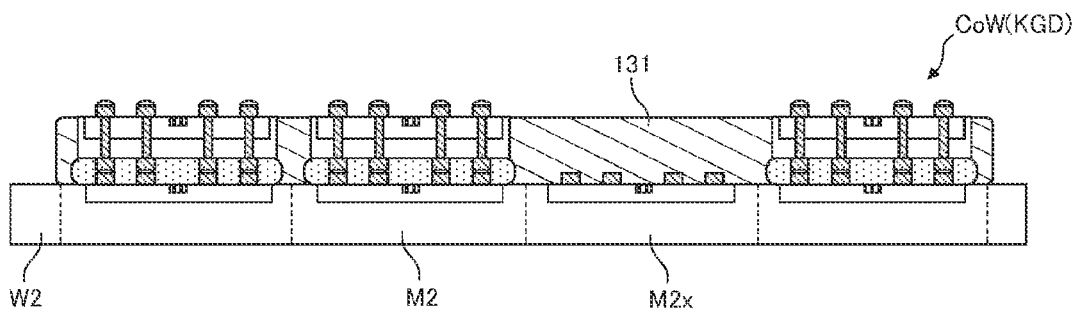

Then, as shown in FIG. 20E, the chip-on-wafer stacked structure CoW is taken out from the mold, and is baked at a predetermined temperature (e.g., 180 degrees Celsius) for a predetermined period of time. As a result, the sealing resin 131 is completely cured. In this manner, the chip-on-wafer stacked structure CoW in which the space between the first memory chips M1 is sealed with the sealing resin 131 and the main surfaces of the first memory chips M1 are exposed from the sealing resin 131 is obtained. Incidentally, if the defective first memory chip M1$x$ is not stacked on the defective second memory chip M2$x$, as shown in FIG. 22C, the corresponding area is sealed with the resin with no first memory chip M1$x$ on the defective second memory chip M2$x$.

Incidentally, step S34 may be performed prior to step S33.

The obtained chip-on-wafer stacked structure CoW may be directly shipped as a chip-on wafer KGD (step S35), or may undergo the subsequent steps (steps S36 to S39) before being shipped as an apparatus or a stacked structure SC.

Figure 21A:
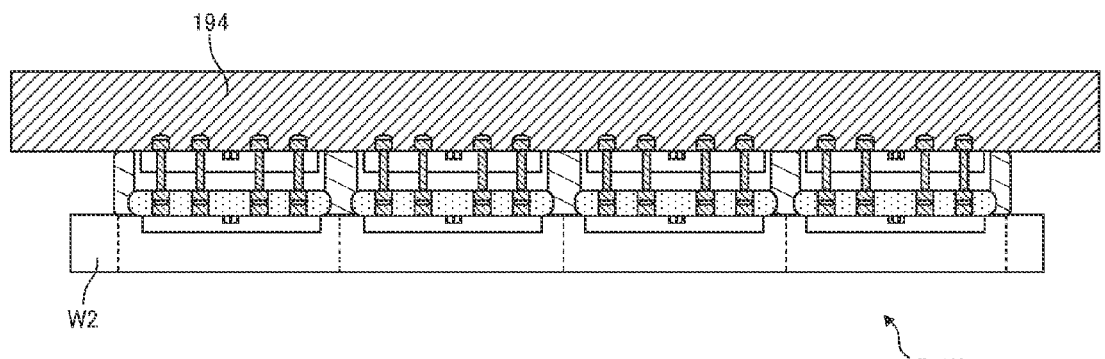

In the case where the chip-on-wafer stacked structure CoW is shipped as a stacked structure SC, as shown in FIG. 21A, a back grind tape 194 is put on one surface (or the side where the main surfaces of the first memory chips M1 are exposed) of the chip-on-wafer stacked structure CoW. The back grind tape 194 is used to protect the one surface (or the side where the main surfaces of the first memory chips M1 are exposed) of the chip-on-wafer stacked structure CoW.

Figure 21B:
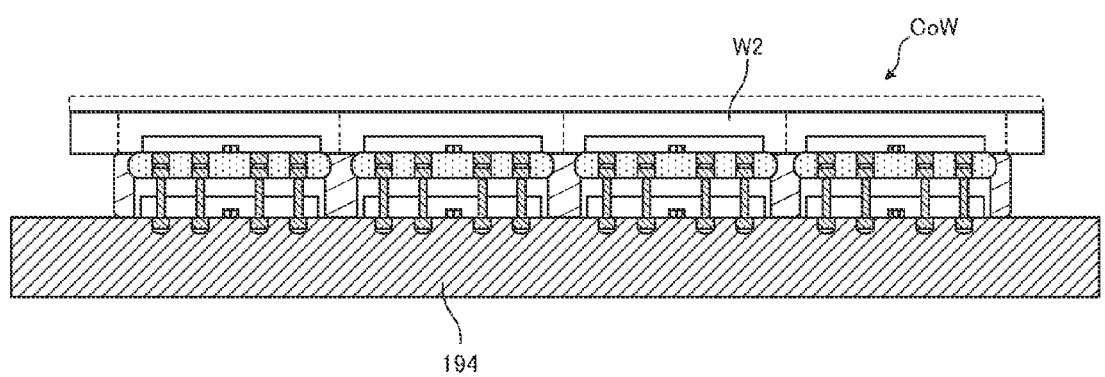

In this state, a back-surface grinding device (not shown) is used to grind the back surface (or the back surface of the semiconductor substrate) of the base wafer W2 as shown in FIG. 21B, thereby making the base wafer W2 thinner (step S36). It is preferred that the back surface be ground in such a way that the thickness of the base wafer W2 after the back-surface grinding, or the thickness of the semiconductor substrate of the second memory chips M2, is thicker than the thickness of the semiconductor substrate of the first memory chips M1. For example, the thickness of the semiconductor substrate of the base wafer W2 is preferably reduced to about 100 μm.

Figure 21C:
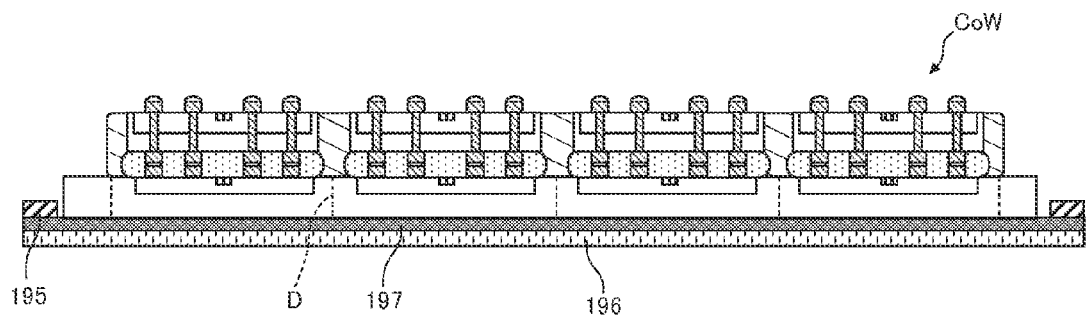
Figure 21D:
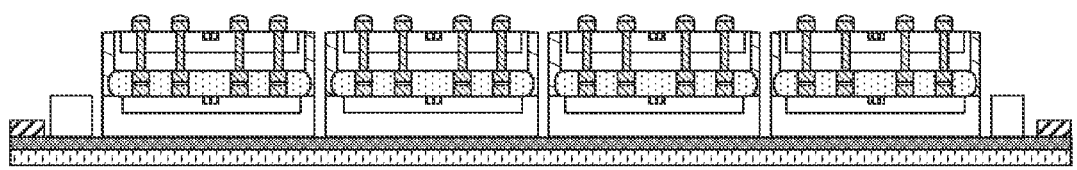

Then, as shown in FIG. 21C, a ring-shaped jig 195 is used to stretch a dicing tape 196 and an adhesive 197 in a disc shape. The back surface of the base wafer W2 is put on the stretched adhesive 197. Then, the back grind tape 194 is removed, and, as shown in FIG. 21D, a dicing device (not shown) is used to cut and singulate the chip-on-wafer stacked structure CoW into individual stacked structures SC (step S37). After that, each of the singulated stacked structures SC is packaged (step S38). As a result, the stacked structures SC having the configuration shown in FIG. 2 are obtained, and can be shipped (step S39).

The manufacturing process of the stacked structure SC has been described. A test process will be detailed below.

As described above, the test process includes the wafer test and the stacking test. The test items are broadly categorized into four: an easy function test, a retention time test, an operation test, and a wafer level burn-in test.

The easy function test is performed to check whether or not a write operation and a read operation can be properly performed. For example, the easy function test is a simple test in which data 0 or 1 is written into all the cells before checking if the data can be read out. The easy function test does not check the data retention characteristics of the memory cells or whether the operating speed meets the standard.

The retention time test checks the data retention characteristics of the memory cells. In a simple retention time test, a test data pattern is written into a memory cell array, and the data is read out after a predetermined hold period has passed. There are many variations of the test method, such as those in which word lines are activated or inactivated during the hold period. Similarly, there are many variations of the test data pattern. Accordingly, given the combinations of the variations of the operation during the hold period and the variations of the test data pattern, a large number of test items exist.

The operation test evaluates various AC parameters, such as a write recovery time (tWR) or RAS to CAS delay time (tRCD). Needless to say, these AC parameters need to meet the standards. The operation test has a large number of test items depending on the type of a parameter to be measured.

The wafer level burn-in test is a test in which a wafer is placed under high temperatures and a high voltage is supplied to each chip on the wafer to expose an initial defect.

Of the above-described four test items, the easy function test, the retention time test, and the operation test are performed by the wafer test system 400 shown in FIG. 12. The wafer level burn-in test is performed by a dedicated wafer level burn-in test system (not shown), not by the wafer test system 400 shown in FIG. 12.

Furthermore, some of the above-described four test items include a fuse programming step. At the fuse programming step, anti-fuses are programmed based on the results of the tests. The fuse programming includes a first fuse programming and a second fuse programming.

The first fuse programming is a process at which the anti-fuses in the forced power-down control circuit 305 shown in FIG. 11 are programmed. More specifically, a high voltage is applied to a to-be-programmed anti-fuse so that the to-be-programmed anti-fuse shifts from a non-conductive state to a conductive state. The first fuse programming is performed to force a chip judged to be defective by the first easy function test, first retention time test, and first operation test during the wafer test, or an unrecoverable chip, into a power-down mode.

The second fuse programming is a process at which the anti-fuses of the defective address holding circuit 304 shown in FIG. 11 are programmed. More specifically, the second fuse programming is a process at which an address of a memory cell judged to be defective by the second easy function test, second retention time test, and second operation test during the stacking test is written to the defective address holding circuit 304. Besides the address, an anti-fuse (not shown in FIG. 11) used for adjustment of a reference power-supply voltage is adjusted during the second fuse programming.

The test process further includes a pass/fail map creation step. At the pass/fail map creation step, a pass/fail map is created to show positional information of defective chips on the wafer. For example, on a pass/fail map of the wafer test, the positions of the above defective first memory chip M1$x$ and defective second memory chip M2$x$ are identified. Therefore, it is possible to avoid stacking a defective chip on a non-defective chip. As a result, the non-defective chip is not wasted. Moreover, the position of a defective stacked structure SC can be identified on a pass/fail map of the stacking test.

Figure 23A:
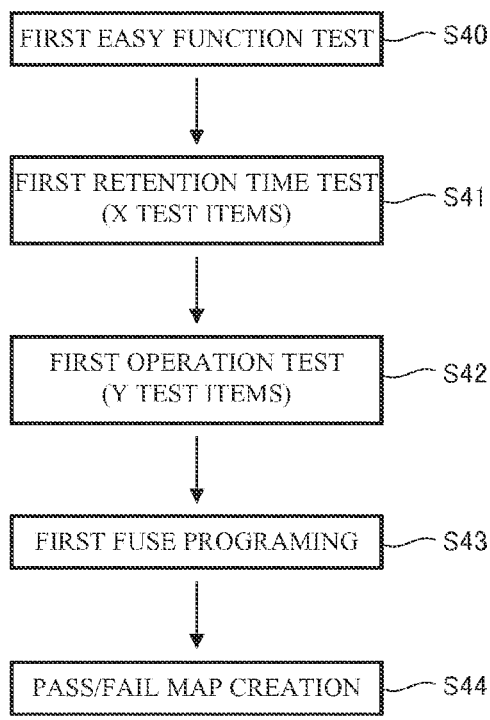
FIG. 23A is a flowchart indicative of an embodiment of the test process of a wafer test.

Turning to FIG. 23A, in the wafer test, the first easy function test (step S40), the first retention time test (step S41), and the first operation test (step S42) are only performed under one temperature condition, i.e. under a high temperature or a low temperature. As a result, the time of the wafer test can be reduced. The test is preferably performed at a temperature somewhere between 50 degrees Celsius and 150 degrees Celsius if performed under the high-temperature condition. The test is preferably performed at a temperature somewhere between −50 degrees Celsius and −5 degrees Celsius if performed under the low-temperature condition.

In the first retention time test (step S41), test items the number of which is X are selected from among a large number of test items, and a test is performed on those test items. Here, X is an integer that is greater than or equal to 1 and is smaller than the number K of test items in the second retention time test (step S52) of the stacking test described later and the number M of test items in the third retention time test (step S56) of the stacking test. It is preferred that X be about one-fifth to one-tenth of K.

In the first operation test (step S42), test items the number of which is Y are selected from among a large number of test items, and a test is performed on those test items. Here, Y is an integer that is greater than or equal to 1 and is smaller than the number L of test items in the second operation test (step S53) of the stacking test described later and the number N of test items in the third operation test (step S57) of the stacking test. It is preferred that Y be about one-fifth to one-tenth of L.

As described above, the wafer test is aimed at identifying an unrecoverable chip. Therefore, a perfect test is not required, because a perfect test is performed in the stacking test after the stacking. Because the wafer test is only performed at either a high or low temperature, and because the number of test items in the first retention time test (step S41) and the first operation test (step S42) has been reduced, the test time of the wafer test can be greatly reduced compared with a conventional pre-stacking test for a single wafer.

Figure 23B:
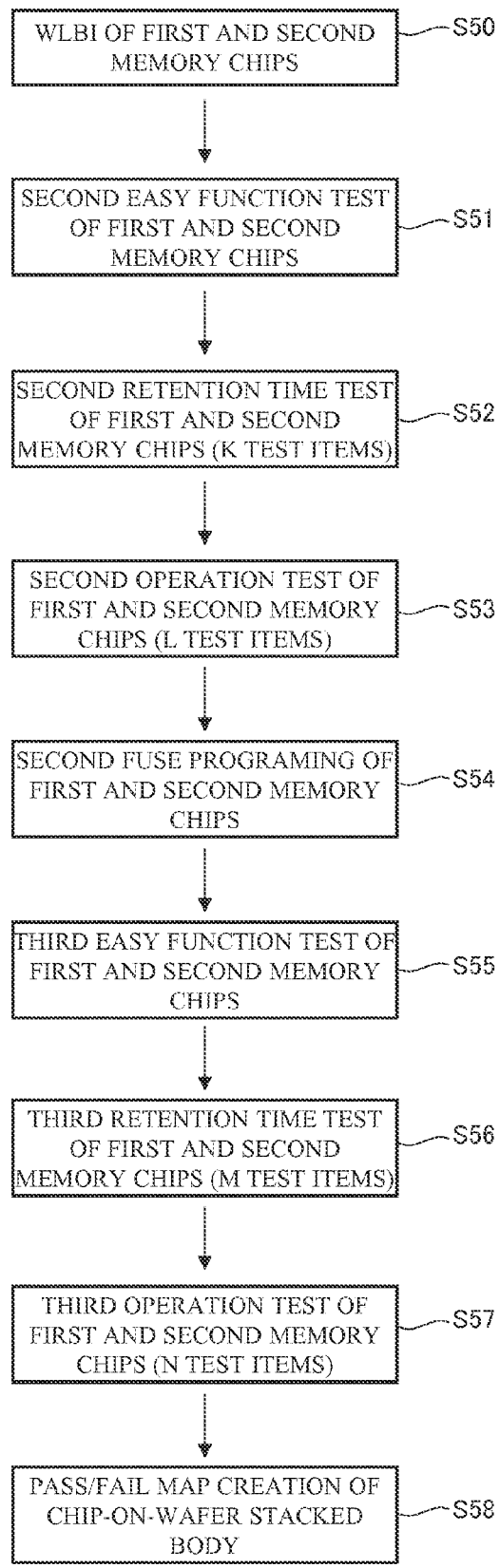
FIG. 23B is a flowchart indicative of an embodiment of the test process of a stacking test.

The stacking test is performed on the chip-on-wafer stacked structure CoW, i.e., the stacking test is performed after the first memory chips M1 are stacked on the second memory chips M2. Accordingly, steps S50 to S57 shown in FIG. 23B are performed on both the first memory chips M1 and the second memory chips M2. A step of creating a pass/fail map (step S58) is performed for each chip-on-wafer stacked structure.

In the stacking test, a second easy function test (step S51), a second retention time test (step S52), a second operation test (step S53), a third easy function test (step S55), a third retention time test (step S56), and a third operation test (step S57) are performed under both a high-temperature and a low-temperature condition.

In this case, the second easy function test (step S51), the second retention time test (step S52), and the second operation test (step S53) are performed to identify a defective memory cell.

The third easy function test (step S55), the third retention time test (step S56), and the third operation test (step S57) are tests that check whether or not each chip works normally, or operates as a non-defective apparatus, after defective recovery is performed at the second fuse programing step (step S54). All that is required here is to check whether or not each chip operates as a non-defective apparatus; the number (M) of test items of the third retention time test (step S56) therefore may be smaller than the number (K) of test items of the second retention time test (step S52). Similarly, the number (N) of test items of the third operation test (step S57) therefore may be smaller than the number (L) of test items of the second operation test (step S53).

As described above, the stacking test is performed on the chip-on-wafer stacked structure CoW, i.e., the stacking test is performed after the first memory chips M1 are stacked on the second memory chips M2. In this state, the first memory chips M1 and the second memory chips M2 can be tested separately. However, it is preferred that the operation of testing the first memory chips M1 at least partially overlap with the operation of testing the second memory chips M2.

If the operation of testing the first memory chips M1 at least partially overlaps with the operation of testing the second memory chips M2, the test time can be reduced compared with the case where the first and second memory chips M1 and M2 are tested without overlapping with each other.

Figure 24:
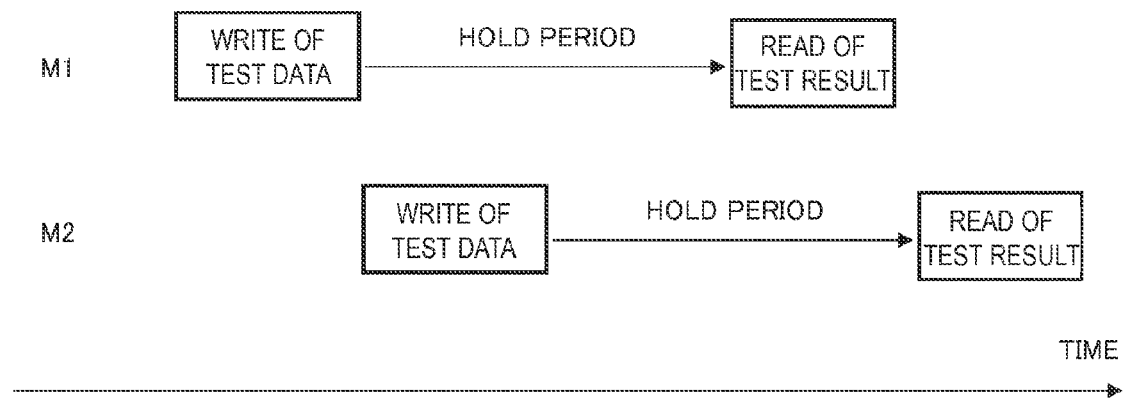
FIG. 24 is a sequence chart indicative of an example in which the operation of testing the first memory chips M1 partially overlaps with the operation of testing the second memory chips M2.

Turning to FIG. 24, the simplest retention time test in which the operation of testing the first memory chips M1 partially overlaps with the operation of testing the second memory chips M2 is shown as an example. This test method can also be applied to the second and third retention time tests (steps S52 and S56) and the second and third operation tests (steps S53 and S57).

As described above, according to the first embodiment, the CoW (Chip on Wafer) method, by which the first memory chips M1 that have been singulated are stacked on the base wafer W2 to form a stacked structure, is used to produce a chip-on-wafer stacked structure CoW or stacked structure SC. Moreover, a test (stacking test) on the first memory chips M1 and the second memory chips M2 is performed through the test pads TP1 of the first memory chips M1 that are located on the upper layer. Accordingly, the wafer test system 400, which is used for the wafer test that is performed on the wafer, can be directly applied to the stacking test. Therefore, there is no need to use a tester dedicated to testing the stacked structure SC. Thus, the manufacturing costs can be reduced.

Figure 26A:
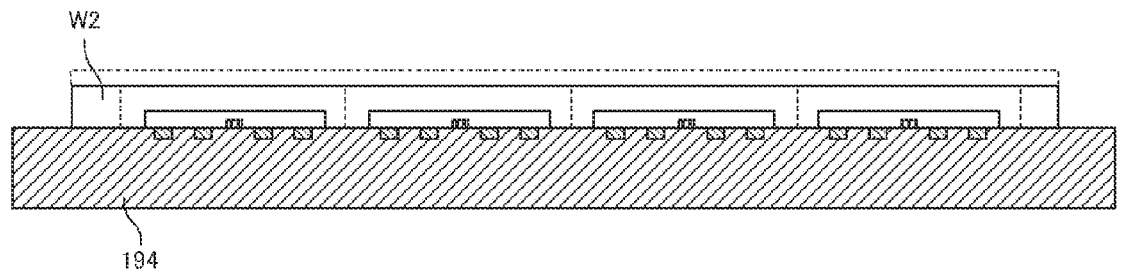
FIGS. 26A to 26C are schematic cross-sectional views indicative of process of a method for manufacturing a chip stacked structure SC according to another modification of the first embodiment.
Figure 26B:
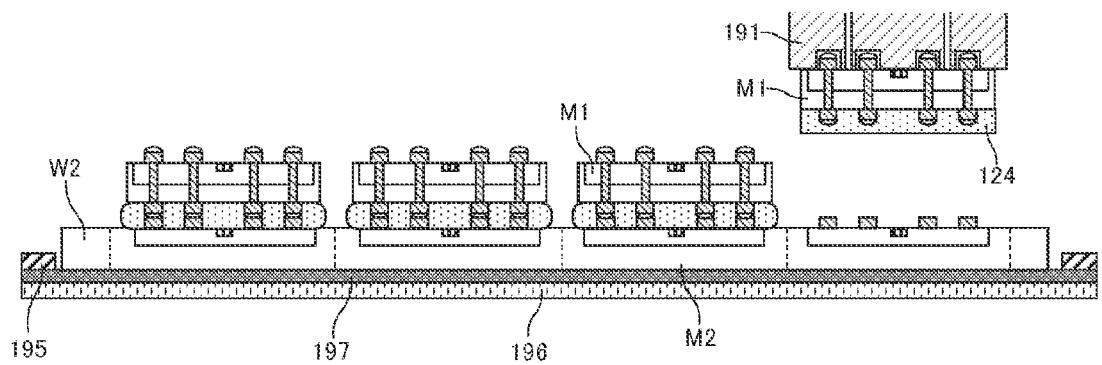
Figure 26C:
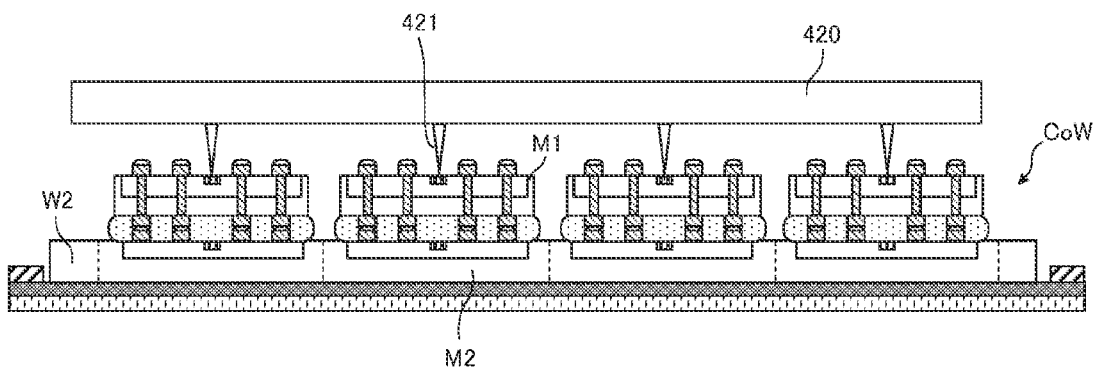

Incidentally, in the above first embodiment, the method in which the individual first memory chips M1 are stacked on the base wafer W2 whose back surface has yet to be ground, and then the back surface of the base wafer W2 is ground in the state of the chip-on-wafer stacked structure CoW is described. However, the present invention is not limited to this. Before the first memory chips M1 are stacked on the base wafer W2, the back surface of the base wafer W2 may be ground. FIG. 26 shows an example thereof. As shown in FIG. 26A, before the first memory chips are stacked, a back grind tape 194 is put on one surface (top surface) of the base wafer W2; the back surface of the base wafer W2 (or the back surface of the semiconductor substrate) is ground to make the base wafer W2 thinner. Then, as shown in FIG. 26B, a ring-shaped jig 195 is used; to a wafer carrier where a dicing tape 196 and an adhesive 197 are stretched in a disc shape, the back surface of the base wafer W2 is attached. In this state, as in the case of FIG. 20A, the singulated first memory chips M1 are stacked on the base wafer W2 in which a plurality of second memory chips M2 are formed. After the chip-on-wafer stacked structure CoW is formed as described above, as in the case of FIG. 20C, the wafer test system 400 shown in FIG. 12 is used to perform the stacking test for both the first memory chips M1 and the second memory chips M2. Incidentally, in the example shown in FIG. 26, there is no need to grind the back surface of the base wafer W2 after the chip-on-wafer stacked structure CoW is formed. Therefore, the molding step shown in FIG. 20D can be omitted.

According to a second embodiment described below, the WoW (Wafer on Wafer) method, by which another wafer W1 is stacked on a base wafer W2 to form a stack, is used to produce a stacked structure SC.

Figure 25A:
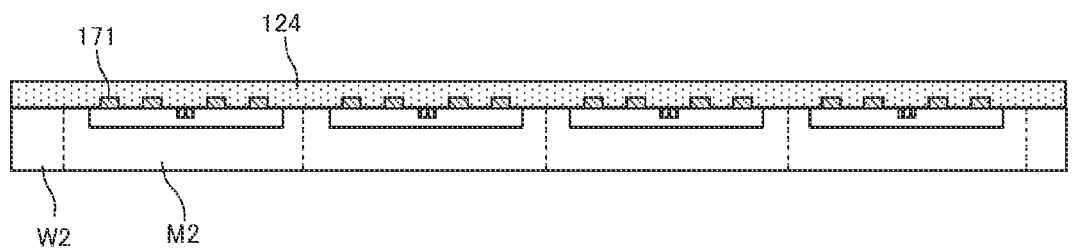
FIGS. 25A to 25D are schematic cross-sectional views indicative of process of a method for manufacturing a chip stacked structure SC according to a second embodiment.

According to the second embodiment, first, as shown in FIG. 25A, on the base wafer W2 (the second memory chips M2) shown in FIG. 18, a filler 124 made of a non-conductive film, such as NCF, is put. Instead of the non-conductive film such as NCF, the filler 124 may be a highly-liquid non-conductive paste, such as NCP. In this case, the wafer test on the second memory chips M2 in the base wafer W2 has already been completed.

Figure 25B:
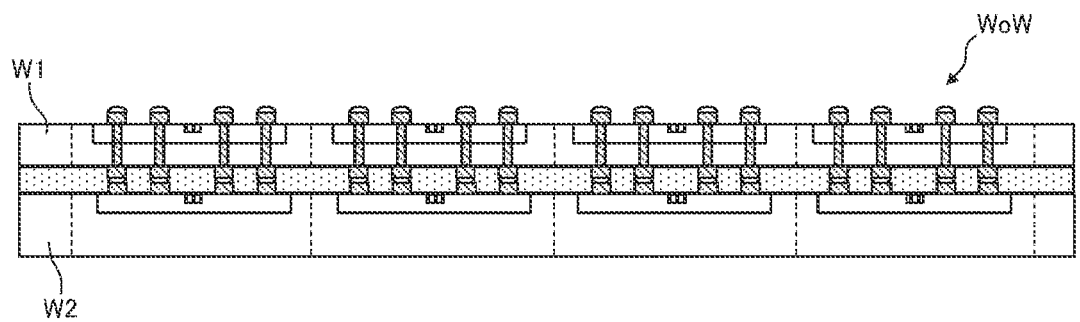

Then, a first wafer W1 (stack wafer), in which through electrodes 174 and back-surface bumps 173 are formed by the step shown in FIG. 16A, is stacked on the base wafer W2 as shown in FIG. 25B. At this time, the stack wafer W1 is stacked in such a way that the back surface of the stack wafer W1 faces the base wafer W2. In this manner, a wafer-on-wafer stacked structure WoW is obtained.

Figure 25C:
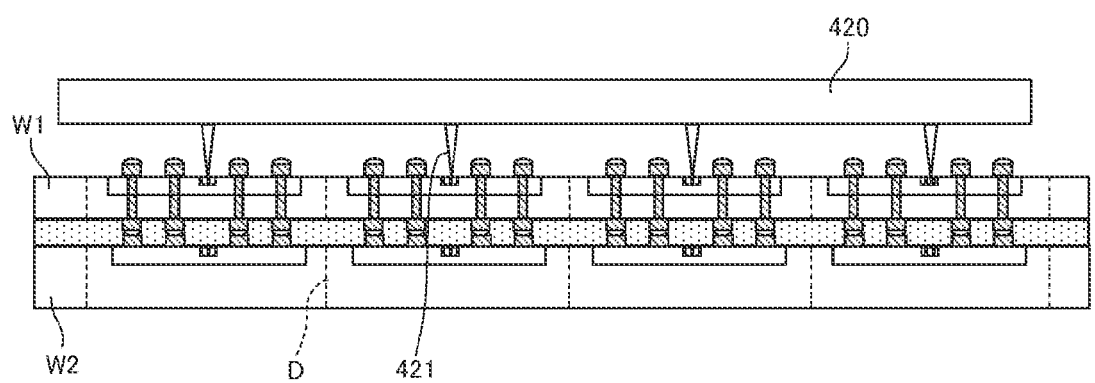
Figure 25D:
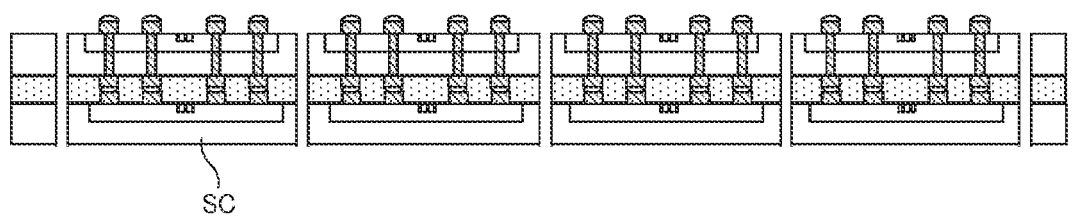

Then, after thermo-compression bonding of the bumps and curing of the filler 124 are performed, the wafer test system 400 shown in FIG. 12 is used to perform a stacking test on the wafer-on-wafer stack (FIG. 25C). The method of the stacking test is basically identical to that of the stacking test of the first embodiment. Then, as shown in FIG. 25D, after the stacking test is finished, a dicing device is used to cut and separate the wafer-on-wafer stack. As a result, singulated stacked structure SC can be taken out.

According to the second embodiment, three types of stacked structure may be obtained: a stacked structure SC (stacked structure of two non-defective chips) in which both the first and second memory chips M1 and M2 are non-defective; a stacked structure SC (stacked structure including one non-defective chip) in which one of the first and second memory chips M1 and M2 is non-defective and the other is defective; and a stacked structure SC (defective stacked structure) in which both the first and second memory chips M1 and M2 are defective. In the case of stacked structure including one non-defective chip, the other chip judged to be defective is forced into a power-down mode, and therefore the one non-defective chip can be used as a one-chip apparatus.

As first to fourth additional examples, variations of the semiconductor apparatus 100 will be described.

Figure 28:
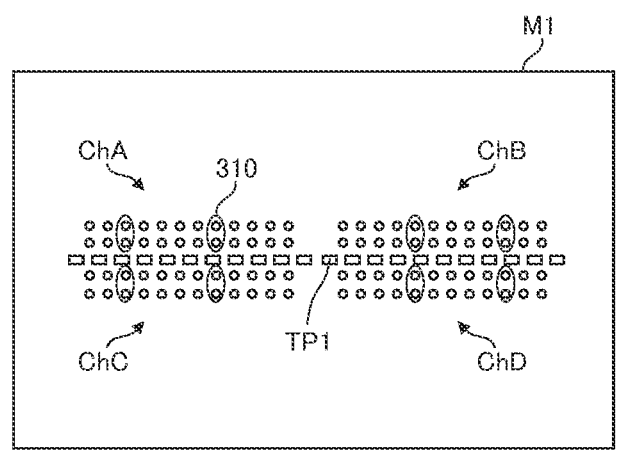
FIG. 28 is a plane view indicative of an embodiment of a first memory chip M1 according to a first additional example.

Turning to FIG. 28, it may be difficult to increase the number of bumps and pads for tests in terms of the layout. In the case of Wide-IO DRAM, as pins for vendors' tests, DA pins 310 are defined by JEDEC (Joint Electron Device Engineering Council). In the following description, assume that 11 DA pins 310 are prepared for each channel CH. Accordingly, a total of 44 DA pins 310 (bumps and through electrodes) are available for the channels CH1 to CH4. Originally, vendors can decide how to use the DA pins 310. In the first additional example, the DA pins 310 are used to input a test signal or a test voltage.

Figure 29:
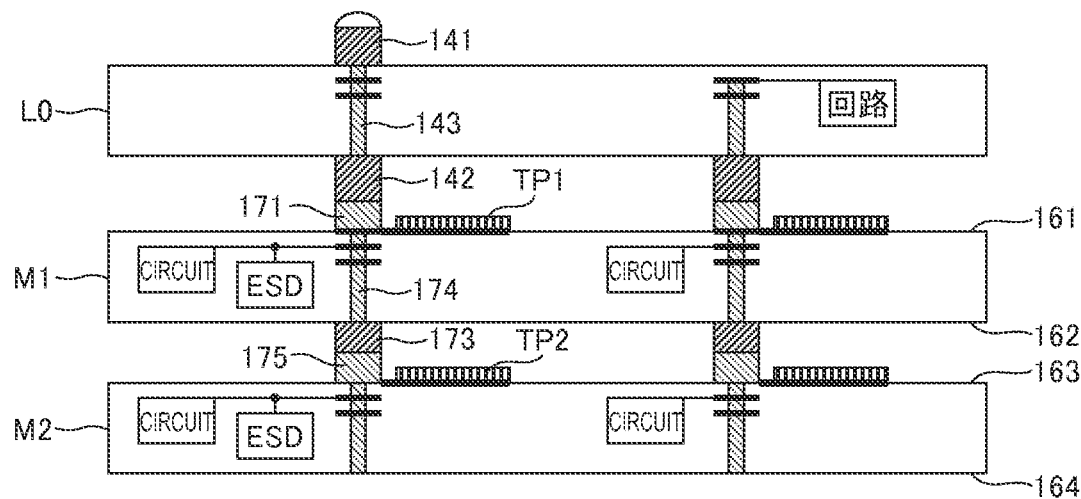
FIG. 29 is a cross-sectional view indicative of a first memory chip M1 and a second memory chip M2 according to a comparative example.

Turning to FIG. 29, the first memory chip M1 is stacked on the second memory chip M2. A logic chip L0 is stacked on a main surface 161 of the first memory chip M1. In the case of the structure shown in FIG. 1B, the first memory chip M1 may be connected to the interposer IP, not to the logic chip L0. In the following description, suppose that the first memory chip M1 is connected to the logic chip L0. However, the basic principle is the same for the interposer IP.

In the case of Wide-IO DRAM, all or some of the DA pins 310 are connected to solder balls 116 (external terminals) via surface bumps 141 of the logic chip L0. For through electrodes that are connected to the external terminals, ESD elements are provided to protect internal circuits (collectively referred to as "memory chip circuits", hereinafter) of the first and second memory chips M1 and M2 from external potential. Among the memory chip circuits, there may be a memory chip circuit that is connected to an internal circuit (referred to as a "logic circuit", hereinafter) of the logic chip L0 via a through electrode. In this case, in order to deal with potential supplied from the logic circuit, a high-impedance through electrode is used to protect the memory chip circuits. However, in terms of the layout of the first and second memory chips M1 and M2, it may be difficult to place the ESD elements or use the high-impedance through electrode.

Figure 30:
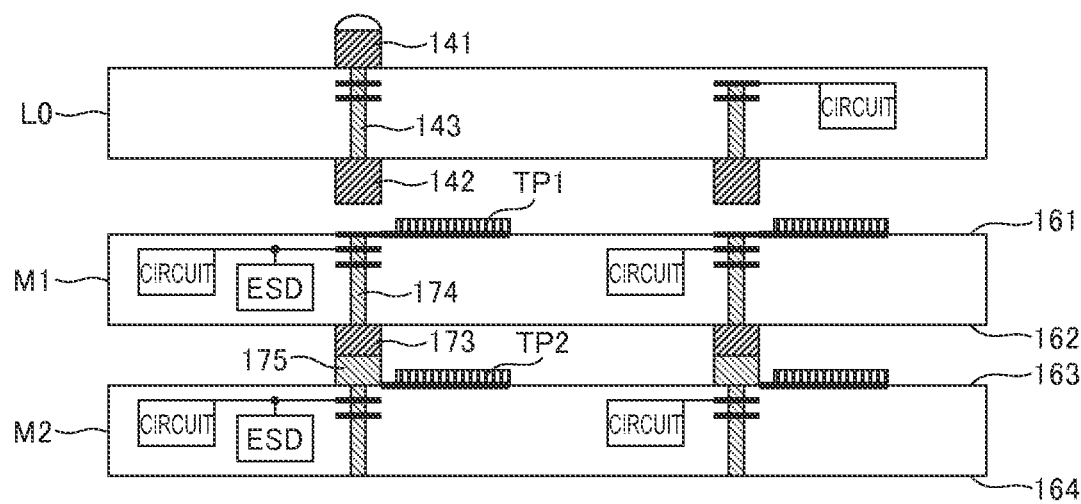
FIG. 30 is a cross-sectional view indicative of a first memory chip M1 and a second memory chip M2 according to the first additional example.

Therefore, as shown in FIG. 30, in the first additional example, for a test through electrode 174, a surface bump 171 is not formed; or the surface bump 171 may be removed after being formed. First, various operation tests are performed on the internal circuits of the first and second memory chips M1 and M2 through test pads TP1 and TP2 before the stacking. After the tests are completed, even if the first memory chip M1, the second memory chip M2, and the logic chip L0 are stacked, the test through electrode 174 is not connected to the logic circuit and external terminals. That is, the test through electrode 174 is electrically isolated. As a result, it is possible to block an overvoltage from being supplied from the external terminals and the logic circuit to the memory chip circuits via the test through electrode 174.

Figure 31:
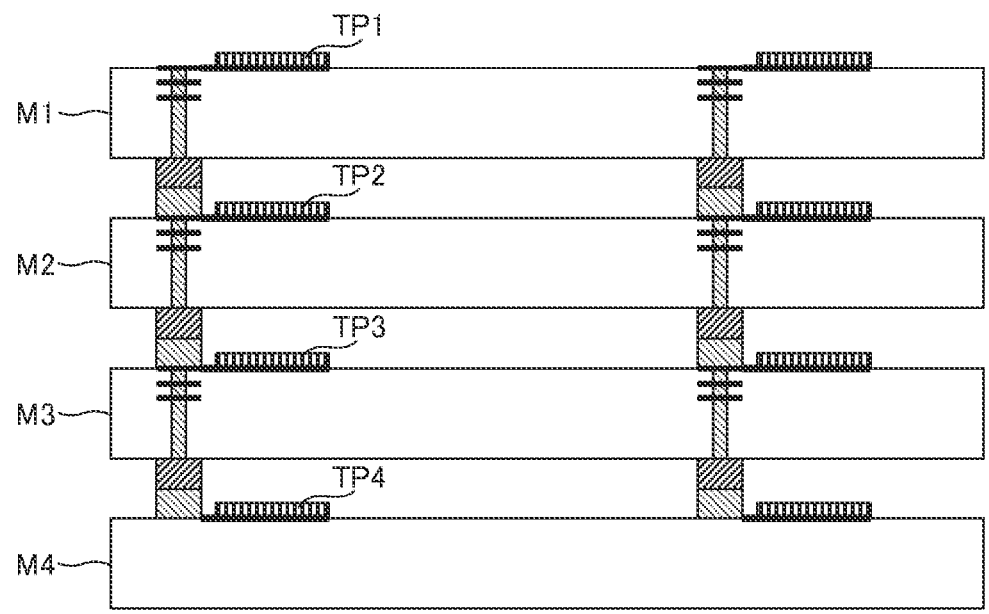
FIG. 31 is a cross-sectional view indicative of first to fourth memory chips M1 to M4 according to the first additional example.

Turning to FIG. 31, the number of memory chips stacked may be greater than or equal to 3. In this case, all that is required is not to form a surface bump 171 only on the first memory chip M1 that is connected to the logic chip L0 or interposer IP. For example, the first memory chip M1 may be produced by a different reticle from those for the other memory chips.

Figure 32:
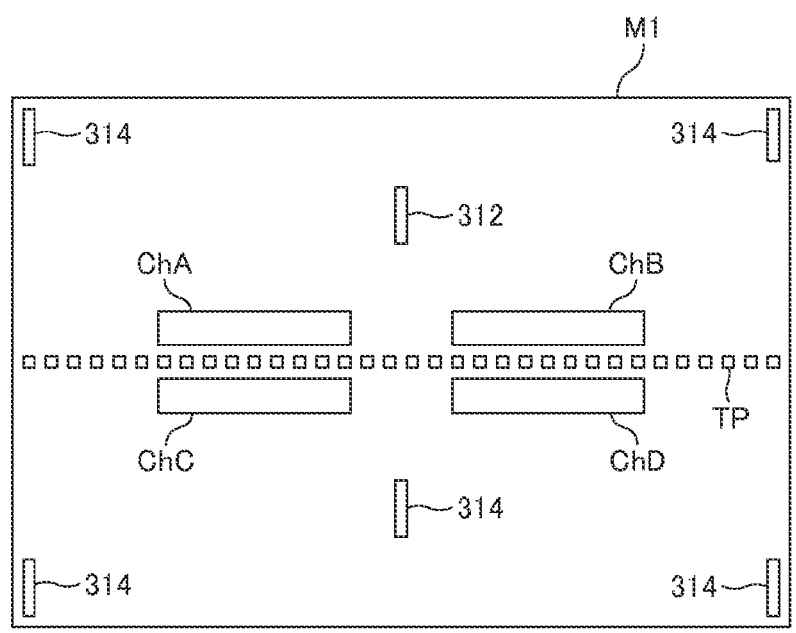
FIG. 32 is a plane view indicative of a first memory chip M1 according to a second additional example.

Turning to FIG. 32, in the case of Wide-IO DRAM, in order to structurally support a stacked structure of a plurality of memory chips, Out-Trigger-Pin 312 and support pins 314 may be provided. Those pins have the same structure as the normal through electrodes. However, those pins are not used as electric signal lines. In the second additional example, instead of the DA pins 310 or in addition to the DA pins 310, Out-Trigger-Pin 312 and support pins 314 are used as signal lines or power-supply lines for tests.

Figure 33:
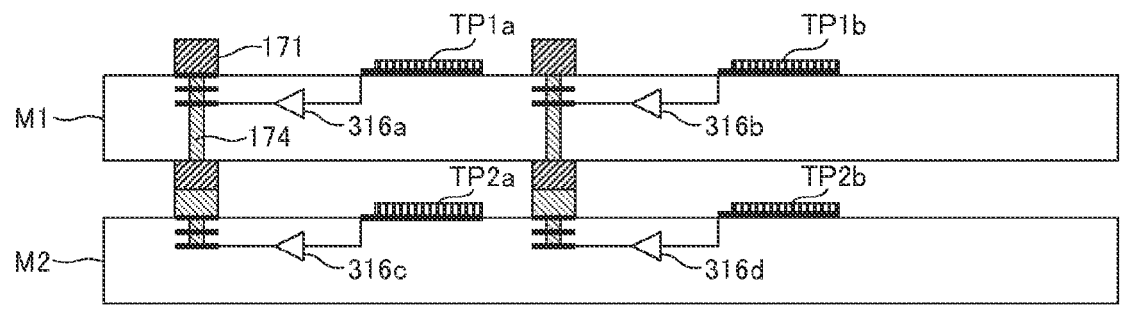
FIG. 33 is a cross-sectional view indicative of a first memory chip M1 and a second memory chip M2 according to a third additional example.

As described above in relation to FIG. 4, particularly in the case of the staggered-type through electrode 174A, a distance from the test pad TP to the through electrode 174A is long, possibly leading to an increase in the resistance at the time of transmission of signals. Therefore, as shown in FIG. 33, in the third additional example, a buffer 316 is provided between a through electrode and a test pad TP to amplify a signal. In FIG. 33, buffers 316a to 316d are provided for test pads TP1a, TP1b, TP2a, and TP2b, respectively.

Figure 34:
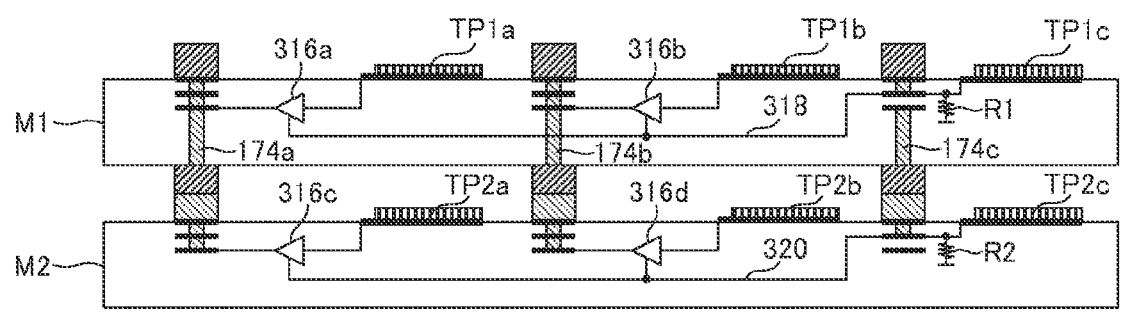
FIG. 34 is a cross-sectional view indicative of a first example of a first memory chip M1 and a second memory chip M2 according to a fourth additional example.
Figure 35:
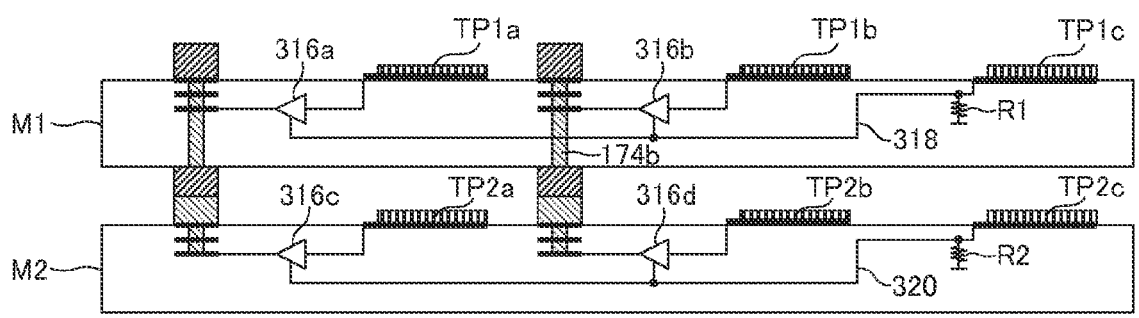
FIG. 35 is a cross-sectional view indicative of a second example of the first memory chip M1 and the second memory chip M2 according to the fourth additional example.

Turning to FIG. 34, to buffers 316a and 316b of the first memory chip M1, potential is supplied from a first power-supply line 318. The first power-supply line 318 is normally set to off-potential through a resistor R1. To the first power-supply line 318, on-potential is supplied from a power-supply control test pad TP1c. The test pad TP1c is also connected to the second memory chip M2 via a through electrode 174c. However, as shown in FIG. 35, the through electrode 174c is not always required. When the first memory chip M1 is tested, the on-potential is supplied from the test pad TP1c, and test signals are supplied from the test pads TP1a and TP1b.

To buffers 316c and 316d of the second memory chip M2, potential is supplied from a second power-supply line 320. The second power-supply line 320 is normally set to off-potential through a resistor R2. To the second power-supply line 320, on-potential is supplied from a power-supply control test pad TP2c.

Figure 36:
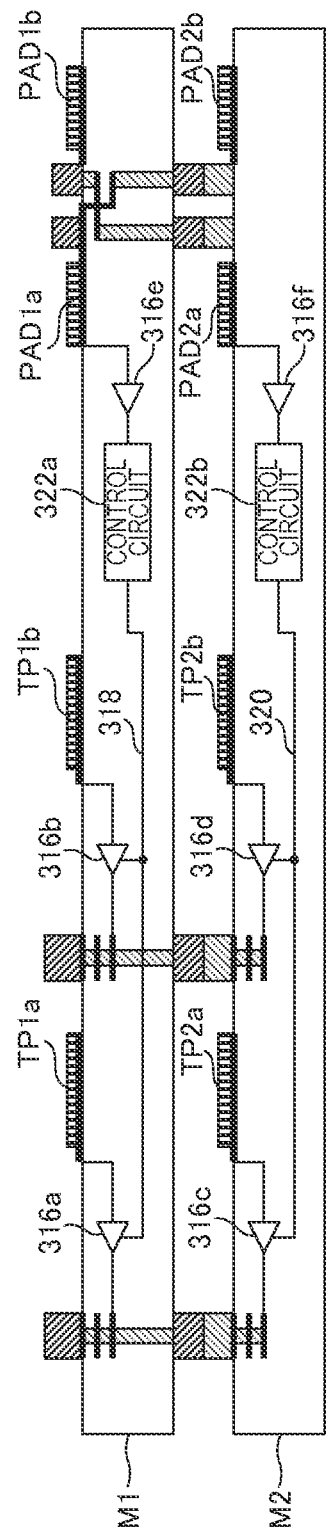
FIG. 36 is a cross-sectional view indicative of a third example of the first memory chip M1 and the second memory chip M2 according to the fourth additional example.

Turning to FIG. 36, through electrodes, which are formed to transmit a chip select signal CS and a clock enable signal CKE and the like, and pads PAD1a, PAD1b, PAD2a, and PAD2b, which are formed for the transmission, are connected to a first power-supply line 318 and a second power-supply line 320. The pad PAD1a is connected to the pad PAD2b, and is for example a pad to which the chip select signal CS is supplied. The pad PAD1b is connected to the pad PAD2a, and is for example a pad to which the clock enable signal CKE is supplied. These pads (signals) are unnecessary when the chips are tested. Therefore, when the tests are performed, these pads are used to supply potential to buffers 316.

In the first power-supply line 318, a control circuit 322a and a buffer 316e are inserted. In the second power-supply line 320, a control circuit 322b and a buffer 316f are inserted. When the second memory chip M2 is tested, the control circuit 322b is in a conductive state. When on-potential is supplied from the pad PAD2a, the buffers 316c and 316d are activated through the buffer 316f. After the test is finished, the control circuit 322b is fixed to off-potential.

When the first memory chip M1 is tested after being stacked on the second memory chip M2, the control circuit 322a is in a conductive state. When on-potential is supplied from the pad PAD1a, the buffers 316a and 316b are activated through the buffer 316e. Meanwhile, the control circuit 322b is fixed to off-potential. Therefore, even if noise emerges on the pad PAD1b during the test of the first memory chip M1, the buffers 316c and 316d of the second memory chip M2 are not activated.

It is apparent that the present invention is not limited to the above embodiments, but may be modified and changed without departing from the scope and spirit of the invention.

Figure 27A:
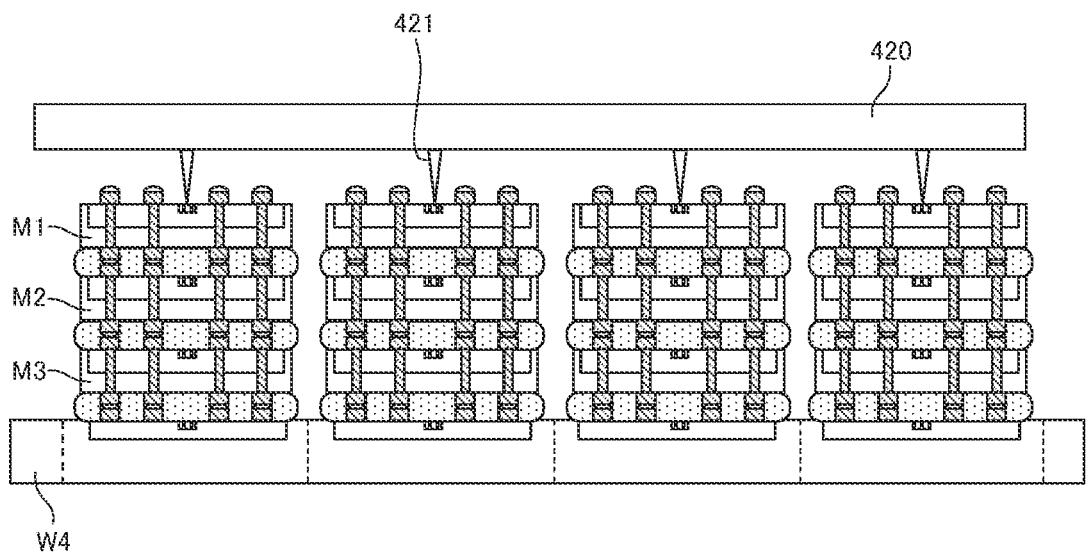
FIG. 27A is a schematic cross-sectional view indicative of an example of a state that three memory chips M1 to M3 are stacked on a base wafer W4.
Figure 27B:
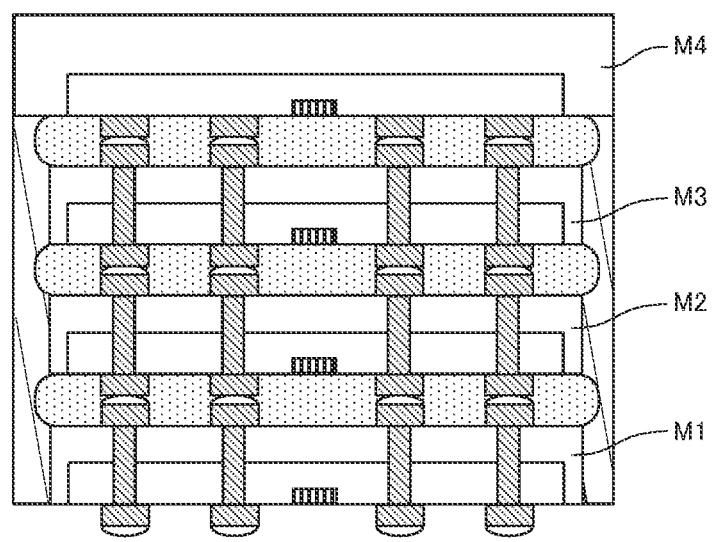
FIG. 27B is a schematic cross-sectional view indicative of a chip stacked structure SC that is obtained from a chip-on-wafer stacked structure CoW shown in FIG. 27A.

For example, the stacked structures according to the present invention are not limited to the structure in which two memory chips are stacked. The stacked structure may have a structure in which any number of memory chips that is equal to or greater than 3 are stacked. Turning to FIG. 27A, the stacking test is performed on three memory chips M1 to M3 stacked on a base wafer W4. FIG. 27B shows a cross-sectional view of a stacked structure SC that is obtained from a chip-on-wafer stacked structure CoW shown in FIG. 27A. In the case of FIG. 27A, a first memory chip M1, a second memory chip M2, a third memory chip M3, and a fourth memory chip M4 (or a plurality of memory chips formed on the base wafer W4) can be tested at once.

Moreover, the wafer-on-wafer stacked structure WoW described in the second embodiment may adopt a structure in which any number of wafers that is equal to or greater than 3 are stacked. Those wafers, the number of which is equal to or greater than 3, can be tested at once.

According to the above-described embodiments, as the semiconductor chips that make up the a stacked structure SC, Wide-IO DRAMs of four-channel configuration are used. However, the type of semiconductor chips that make up the a stacked structure SC is not limited to this. The present invention may be applied to other kinds of memory chips, or semiconductor chips other than the memory chips. Even if Wide-IO DRAMs are used, the number of channels is not limited to 4. It is preferred that the number of channels for Wide-IO DRAMs be equal to 4n (n is an integer greater than or equal to 1).

According to the above-described embodiments, a method in which a circuit layer C is formed and then a through substrate via 231 is formed in a semiconductor substrate 200 from a back surface side of the semiconductor substrate 200 to form a through-substrate conductor 233, or an example of a so-called via-last back-surface process is described. However, the present invention is not limited to this. For example, the present invention can be applied to wafers and chips having through electrodes that are formed by various processes such as a via-first FEOL (front-end-of-line) process, a via-first BEOF (back-end-of-line) process, and a via-last surface process.

What is claimed is:

1. A method for manufacturing a tested apparatus, the method comprising:
    forming a stacked structure that includes a plurality of first semiconductor chips stacked over a semiconductor wafer, the semiconductor wafer comprising a plurality of second semiconductor chips that are arranged in matrix of a plurality of rows and columns, each of the first and second semiconductor chips includes a first conductive structure and a second conductive structure that is (1) electrically isolated from the first conductive structure and (2) staggered such that a portion of the second conductive structure overlaps the first conductive structure, the portion of the second conductive structure of each of the first semiconductor chips being stacked over and electrically connected to the first conductive structure of a different one of the second semiconductor chips;
    contacting a probe card to at least one of the first semiconductor chips;
    while contacting the probe card, performing a first test operation on the at least one of the first semiconductor chips via the first conductive structure of the at least one of the first semiconductor chips; and
    while performing the first test operation, performing a second test operation independent of the first test operation on a corresponding one of the second semiconductor chips over which the at least one of the first semiconductor chips is stacked via the second conductive structure of the at least one of the first semiconductor chips.

2. The method as claimed in claim 1, wherein the contacting the probe card comprises contacting the probe card to the at least one of the first semiconductor chip to perform the first test operation on an internal circuit of the at least one of the first semiconductor chips.

3. The method as claimed in claim 2, wherein a period of time when the first test operation is performed on the corresponding one of the second semiconductor chip and a period of time when the first test operation is performed on the at least one of the first semiconductor chip, during the contacting, partly overlap with each other.

4. The method as claimed in claim 1, wherein the forming the stacked structure comprises:
    providing an additional semiconductor wafer in which the first semiconductor chips are arranged in matrix of a plurality of rows and columns; and
    dicing the additional semiconductor wafer to separate the first semiconductor chips from one another and stack the first semiconductor chips over the semiconductor wafer.

5. The method as claimed in claim 1, wherein the forming the stacked structure comprises:
    providing an additional semiconductor wafer in which the first semiconductor chips are arranged in matrix of a plurality of rows and columns; and
    stacking the additional semiconductor wafer over the semiconductor wafer to form the stacked structure.

6. The method as claimed in claim 1, wherein the forming the stacked structure comprises stacking a defective one of the first semiconductor chips over a defective one of the second semiconductor chips.

7. The method as claimed in claim 1, further comprising dicing at least semiconductor wafer to separate the tested apparatus from one another.

8. The method as claimed in claim 1, wherein each of the first semiconductor chips includes a first semiconductor substrate including a first surface over which a plurality of first circuits are formed and a second surface that is opposite to the first surface, each of the second semiconductor chips includes a second semiconductor substrate including a third surface over which a plurality of second circuits are formed and a fourth surface that is opposite to the third surface, and each of the first semiconductor chips is stacked over a corresponding one of the second semiconductor chips so that the second surface of the first semiconductor substrate faces to the third surface of the corresponding one of the second semiconductor chips.

9. The method as claimed in claim 8, wherein each of the first semiconductor chips includes a plurality of through substrate conductors penetrating through the first substrate of each of the first semiconductor chips.

10. The method as claimed in claim 1, further comprising determining that the corresponding one of the second semiconductor chips is defective based on the second test operation and subsequently deactivating the second semiconductor chip.

11. The method as claimed in claim 10 wherein deactivating the second semiconductor circuit includes programming an anti-fuse element of the corresponding one of the second semiconductor chips.

12. The method as claimed in claim 1 wherein the portion of the second conductive structure includes a wiring layer.

13. The method as claimed in claim 1 wherein the portion of the second conductive structure includes a through-hole conductor.

14. The method as claimed in claim 1 wherein the first conductive structure includes a surface bump, and wherein the portion of the second conductive structure include a through-hole conductor aligned with the surface bump.

15. The method as claimed in claim 1 wherein the first conductive structure includes a first surface bump, and wherein the portion of the second conductive structure includes a second surface bump aligned with the first surface bump.

16. The method as claimed in claim 1 wherein:
    performing the first test operation includes performing the first test operation over a first period of time; and
    performing the second operation includes performing the second test operation over a second period of time that overlaps the first period of time.

17. A method for manufacturing a tested apparatus, the method comprising:
    stacking a first semiconductor chip over a second semiconductor chip that is arranged in a matrix with a plurality of other semiconductor chips in a semiconductor wafer, wherein the first and second semiconductor chips each include an internal circuit, a first conductive structure electrically coupled to the internal circuit, and a second conductive structure electrically isolated from the internal circuit, wherein the second conductive structure is staggered such that a portion of the second conductive structure extends beneath the first conductive structure;
    coupling the portion of the second conductive structure of the first semiconductor chip to the first conductive structure of the second semiconductor chip;
    performing a first electrical test of the internal circuit of the first semiconductor chip over a first period of time and via the first conductive structure of the first chip; and
    performing a second electrical test of the internal circuit of the second semiconductor chip over a second period of time and via the second conductive structure of the first semiconductor chip, wherein the second period of time overlaps the first period of time, and wherein the second electrical test is performed separately from the first electrical test of the internal circuit of the first semiconductor chip.

18. The method as claimed in claim 17 wherein the second conductive structure of the second semiconductor chip is electrically isolated from the internal circuit of the first semiconductor chip.

* * * * *